(12) United States Patent
McCallister et al.

(10) Patent No.: US 8,489,047 B2
(45) Date of Patent: *Jul. 16, 2013

(54) TRANSMITTER LINEARIZED USING BIAS DEVIATION GAIN ADJUSTMENT AND METHOD THEREFOR

(75) Inventors: Ronald Duane McCallister, Scottsdale, AZ (US); Eric M. Brombaugh, Mesa, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 204 days.

This patent is subject to a terminal disclaimer.

(21) Appl. No.: 12/917,878

(22) Filed: Nov. 2, 2010

(65) Prior Publication Data

US 2012/0108189 A1    May 3, 2012

(51) Int. Cl.
  *H04B 1/04* (2006.01)
  *H01Q 11/12* (2006.01)
(52) U.S. Cl.
  USPC .......... 455/127.1; 455/114.3; 455/127.2; 375/297
(58) Field of Classification Search
  USPC .......... 455/91, 114.2–115.1, 127.1–127.2; 375/295–297
  See application file for complete search history.

(56) References Cited

U.S. PATENT DOCUMENTS

| | | | |
|---|---|---|---|
| 4,591,803 A | 5/1986 | Saleh | |
| 5,272,450 A | 12/1993 | Wisherd | |
| 5,923,712 A * | 7/1999 | Leyendecker et al. | 375/297 |
| 6,081,160 A | 6/2000 | Custer et al. | |
| 6,118,335 A * | 9/2000 | Nielsen et al. | 330/2 |
| 6,377,116 B1 * | 4/2002 | Mattsson et al. | 330/2 |
| 6,794,939 B2 * | 9/2004 | Kim et al. | 330/149 |
| 7,091,779 B2 * | 8/2006 | Sahlman | 330/149 |
| 7,106,134 B2 | 9/2006 | Khanifar et al. | |
| 7,113,036 B2 * | 9/2006 | Moffatt et al. | 330/149 |
| 7,145,962 B2 * | 12/2006 | Lee | 375/296 |
| 7,170,343 B2 | 1/2007 | Jin et al. | |

(Continued)

FOREIGN PATENT DOCUMENTS

KR    2001-0083262 A    9/2001

OTHER PUBLICATIONS

Alghanim et al., "Reduction of Electrical Baseband Memory Effect in High-Power LDMOS Devices Using Optimum IF Termination", (Microwave Symposium Digest, 2008 IEEE MTT-S International), Jun. 2008, pp. 415-418, Atlanta, Georgia.

(Continued)

*Primary Examiner* — Simon Nguyen
(74) *Attorney, Agent, or Firm* — Schmeiser, Olsen & Watts LLP; Lowell W. Gresham

(57) ABSTRACT

A transmitter (50) includes a low power memoryless nonlinear predistorter (58) that inserts predistortion configured to address a nonlinearity (146) corresponding to gain droop and another nonlinearity (148) corresponding to deviations from an average bias condition. When efforts are taken to reduce memory effects, such as configuring a network of components (138) that couple to an HPA (114) to avoid resonance frequencies within a video bandwidth (140), high performance linearization at low power results without extending linearization beyond that provided by the memoryless nonlinear predistorter (58). Each nonlinearity is addressed by applying gain to a communication signal (54). The amount of gain applied is determined by a look-up table (170) for one nonlinearity (146) and by a look-up table (198) in combination with a differentiator (202) for the other nonlinearity (148). The look-up tables (170, 198) are updated in accordance with modified LMS control loops.

28 Claims, 8 Drawing Sheets

U.S. PATENT DOCUMENTS

| | | | | |
|---|---|---|---|---|
| 7,289,773 | B2* | 10/2007 | Braithwaite | 455/91 |
| 7,469,491 | B2 | 12/2008 | McCallister et al. | |
| 7,479,828 | B2 | 1/2009 | Benedict | |
| 7,551,905 | B2 | 6/2009 | Kubo et al. | |
| 7,583,754 | B2* | 9/2009 | Liu | 375/297 |
| 7,773,692 | B2 | 8/2010 | Copeland et al. | |
| 7,904,033 | B1* | 3/2011 | Wright et al. | 455/114.2 |
| 8,040,182 | B2* | 10/2011 | Horiguchi et al. | 330/149 |
| 8,055,217 | B2* | 11/2011 | Ba et al. | 455/114.3 |
| 8,068,574 | B2* | 11/2011 | Norris et al. | 375/358 |
| 8,093,949 | B2* | 1/2012 | Brown et al. | 330/149 |
| 8,095,090 | B2* | 1/2012 | Drogi et al. | 455/127.1 |
| 2003/0169829 | A1 | 9/2003 | Vella-Coleiro | |
| 2004/0179629 | A1* | 9/2004 | Song et al. | 375/296 |
| 2004/0198268 | A1 | 10/2004 | Rashev et al. | |
| 2004/0252783 | A1* | 12/2004 | Kim et al. | 375/296 |
| 2004/0257157 | A1* | 12/2004 | Sahlman | 330/149 |
| 2008/0095266 | A1* | 4/2008 | Rashev et al. | 375/298 |
| 2008/0287076 | A1 | 11/2008 | Shen et al. | |
| 2009/0097590 | A1 | 4/2009 | McCallister et al. | |
| 2009/0111399 | A1* | 4/2009 | Norris et al. | 455/114.3 |
| 2009/0124218 | A1 | 5/2009 | McCallister et al. | |
| 2009/0227215 | A1 | 9/2009 | McCallister | |
| 2009/0323856 | A1 | 12/2009 | McCallister | |
| 2010/0158155 | A1* | 6/2010 | Borkar et al. | 375/297 |
| 2012/0122411 | A1* | 5/2012 | Chan et al. | 455/126 |

OTHER PUBLICATIONS

Cavers, "A Linearizing Predistorter With Fast Adaptation", (40th IEEE Vehicular Technology Conference), May 1990, pp. 41-47, Canada.

Cha et al., "Memory Effect Minimization and Wide Instantaneous Bandwidth Operation of a Base Station Power Amplifier", (Microwave Journal 2007 Issue), Jan. 2007, pp. 66-76, Vol. 50, No. 1, South Korea.

Chalermwisutkul, "Phenomena of Electrical Memory Effects on the Device Level and Their Relations", (Proceedings of ECTI-CON 2008), May 2008, pp. 229-232, Thailand.

Ding et al., "A Memory Polynomial Predistorter Implemented Using TMS320C67XX", (Proceedings of Texas Instruments Developer Conference), Feb. 2004, pp. 1-7, Texas, USA.

Doudorov, "Evaluation of Si-LDMOS Transistor for RF Power Amplifier in 2-6 GHz Frequency Rang", (MS Thesis, Linköping University), Jun. 5, 2003, Linköping, Sweden.

Liu et al., "Deembedding Static Nonlinearities and Accurately Identifying and Modeling Memory Effects in Wide-Band RF Transmitters", (IEEE Transactions on Microwave Theory and Techniques), Nov. 2005, pp. 3578-3587, vol. 53, No. 11, Canada.

Liu et al., "Linearization of Wideband RF Doherty Power Amplifiers with Complex Dynamic Nonlinearities", (Communications and Networking in ChinaCom 2008), Aug. 2008, pp. 974-977, China.

Morgan et al., "A Generalized Memory Polynomial Model for Digital Predistortion of RF Power Amplifiers", (IEEE Transactions on Signal Processing), Oct. 2006, pp. 3852-3860, vol. 54, No. 10, Canada.

Paasschens et al., "Dependence of Thermal Resistance on Ambient and Actual Temperature", (Proceedings of the 2004 Meeting on Bipolar Bicmos Circuits & Technology), Sep. 2004, pp. 96-99, The Netherlands.

Rahkonen et al., "Polynomial 2.1 GHz RF Predistorter IC With Envelope Injection Output", (Norchip Conference Oulu, University of Oulu), Nov. 21-22, 2005, pp. 230-233, Oulu, Finland.

Rey et al., "RF Power Amplifier Modeling Using Polynomials With IIR Bases Functions", (IEEE Microwave and Wireless Components Letters, © 2009 IEEE), pp. 43-46, Canada.

Saleh, et al., "Improving the Power-Added Efficiency of FET Amplifiers Operating with Varying-Envelope Signals", (IEEE Transactions on Microwave Theory and Techniques), vol. 31, No, 1, Jan. 1983.

Schurack et al., "Analysis and Measurement of Nonlinear Effects in Power Amplifiers Caused by Thermal Power Feedback", (IEEE International Symposium on Circuits and Systems), May 1992, pp. 758-761, Munich, Germany.

Stevenson Kenney, et al., "Identification of RF Power Amplifier Memory Effect Origins using Third-Order Intermodulation Distortion Amplitude and Phase Asymmetry", School of Electrical and Computer Engineering, Georgia Institute of Technology, Atlanta, Georgia, 2006 IEEE.

Tornblad et al., "Modeling and Measurements of Electrical and Thermal Memory Effects for RF Power LDMOS", (IEEE/MTT-S International Microwave Symposium), Jun. 2007, pp. 2015-2018, USA.

Vuolevi, et al., "Distortion in RF Power Amplifiers", Chapter 7, 2003, Artech House, Inc., Norwood, Massachusetts.

Younes et al., "An Accurate Complexity-Reduced "PLUME" Model for Behavioral Modeling and Digital Predistortion of RF Power Amplifiers", (© 2010 IEEE), pp. 1-9, Canada.

Zhu et al., "An Overview of Volterra Series Based Behavioral Modeling of RF/Microwave Power Amplifiers", (RF & Microwave Research Group University College Dublin © 2006 IEEE), pp. 1-5, Ireland.

Yong-Sheng et al., "Research of Electro-Thermal Memory Effect of RF Power Amplifier based on LDMOS EFT", (4th Asia-Pacific Conference on Environmental Electromagnetics), Aug. 2006, CEEM'2006/Dalian 4A2-09, pp. 787-791, China.

Kwon, "Digitally Enhanced CMOS RF Transmitter With Integrated Power Amplifier", (University of Illinois at Urbana-Champaign, 2010 Dissertation), May 2010, Illinois.

Li et al., "A Fast Digital Predistortion Algorithm for Radio-Frequency Power Amplifier Linearization With Loop Delay Compensation", (IEEE Journal of Selected Topics in Signal Processing), Jun. 2009, pp. 374-383, vol. 3, No. 3.

International Search Report and the Written Opinion of PCT/US2011/057231, ISA, Jan. 31, 2012.

* cited by examiner

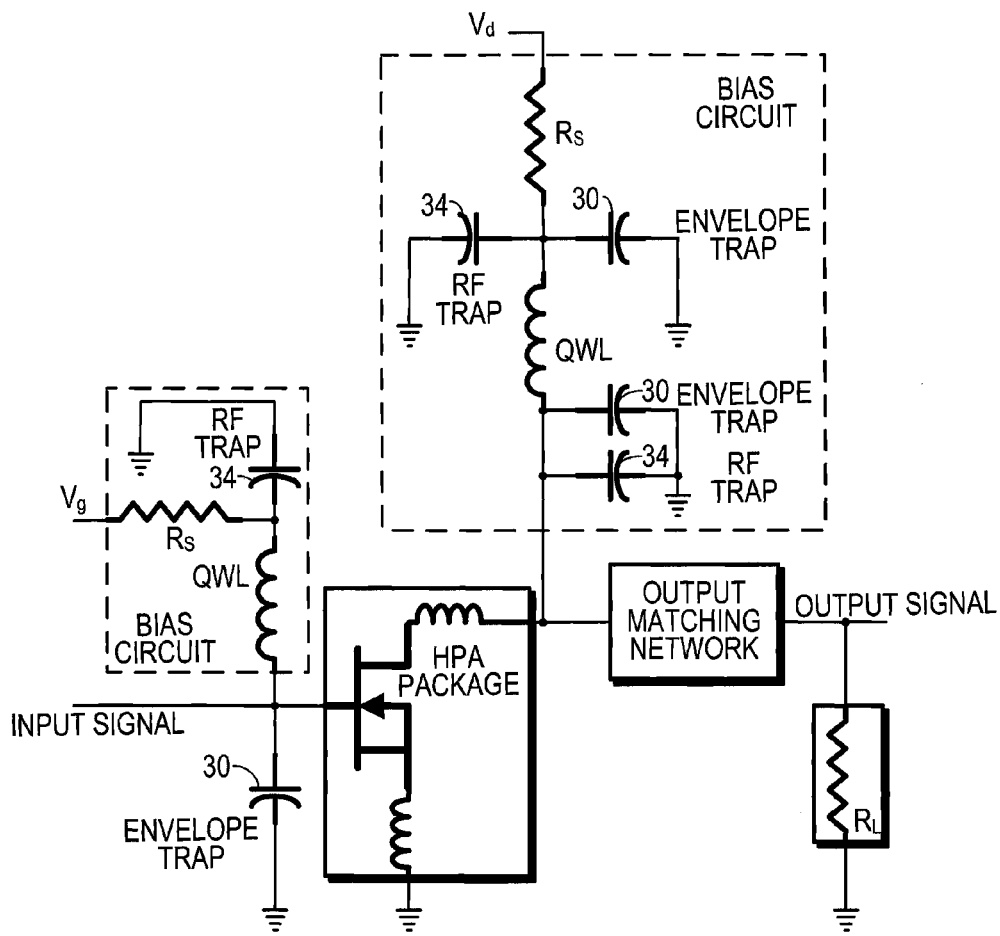
FIG. 1  *PRIOR ART*
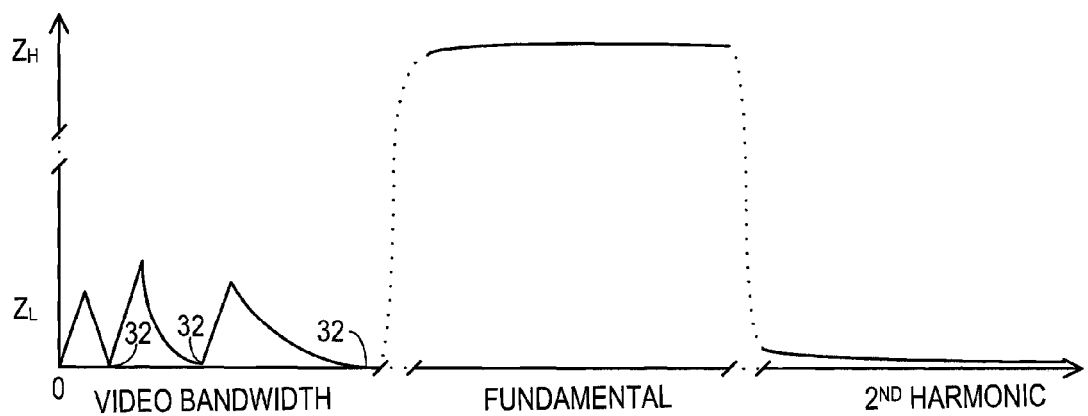
FIG. 2  *PRIOR ART*

TRANSMITTER LINEARIZED USING BIAS DEVIATION GAIN ADJUSTMENT AND METHOD THEREFOR

TECHNICAL FIELD OF THE INVENTION

The present invention relates generally to the field of communication systems. Specifically, the present invention relates to predistorters which reduce distortion introduced into a communication signal by an imperfectly linear amplifier.

BACKGROUND OF THE INVENTION

Many popular modulation formats used in the field of digital communications assume the availability of a linear amplifier in a transmitter to boost a communication signal to a level at which it may be successfully broadcast from an antenna, then propagate to and be demodulated by a remotely located receiver. Linearity refers to the ability of an amplifier to faithfully reproduce a signal presented to it without causing the output signal from the amplifier to be distorted in some way. To the extent that the amplifier is imperfectly linear, distortion and spectral regrowth result. If this distortion and spectral regrowth are excessive, then the transmitter may fail to successfully operate within a spectral mask imposed by regulations and/or within power specifications.

Non-linearity in an amplifier causes the generation of signal harmonics as a unwanted byproduct of amplification. Even ordered harmonics include near DC, low frequency components, collectively referred to as a video signal. The second harmonic forms a video component occupying double the baseband bandwidth, the fourth harmonic forms a video component occupying quadruple the baseband bandwidth, and so on. This envelope-induced video signal modulates amplifier gain causing further deterioration in amplifier linearity.

FIG. 1 shows a representative amplifier portion of a conventional RF transmitter. To minimize distortion resulting from the video signal, the bias circuits and matching networks for the amplifier are conventionally configured to have as low an impedance to ground in the video band as possible. The lower the video impedance, the lower the video signal voltage, the smaller the envelope-induced bias modulation, and the smaller the distortion resulting from the video signal. In this conventional approach a number of decoupling capacitors 30, often more than the three depicted in FIG. 1, have been included to implement an envelope trap by lowering the impedance in the video signal bandwidth.

FIG. 2 shows a chart of representative bias circuit impedances presented to an amplifier in accordance with a conventional approach that uses envelope trapping. Throughout the video bandwidth, one or more impedance minima 32 are presented, causing the overall impedance to remain in a low impedance range $Z_L$. Each impedance minima 32 occurs at a resonance frequency for the network of components coupled to the HPA. The resonance frequencies are determined by the decoupling capacitors 30 operating in connection with other components that are largely inductive, such as quarter-wave (QWL) transmission lines (for the fundamental RF band), HPA package bondwires, and the like. Thus, capacitance values are chosen and decoupling capacitors 30 placed in positions in the network of components where different resonance frequencies can be achieved to maintain overall video bandwidth impedance in the low impedance range $Z_L$.

FIG. 2 also shows that in addition to low video impedance the bias circuits coupled to the HPA present a high impedance $Z_H$ throughout the fundamental RF frequency range, and impedance returns to the low impedance range $Z_L$ at higher harmonics. The high impedance range $Z_H$ exhibited in the fundamental RF band results in large part from the high impedance exhibited by the quarter-wave transmission line in the fundamental RF band. High impedance for bias circuits in the fundamental RF band is desirable because it blocks the fundamental RF energy away from the bias circuits, causing the fundamental RF energy to flow through the output matching network and across a load $R_L$, which exhibits a much lower impedance in the fundamental RF band. The low impedance range $Z_L$ exhibited by bias circuits at second and higher harmonics results from the presence of decoupling capacitors 34 (FIG. 1) to form an RF trap. This band of low impedance is desirable because it helps shunts unwanted RF energy, including higher harmonic energy, to ground, effectively removing it from the output signal and preventing it from interfering with amplifier operation.

Through the use of envelope trapping, the video signal is held to a low level, and the distortion it causes in an amplified output signal is likewise reduced. But the video signal is not eliminated, so the distortion it causes remains to some extent. And, as bandwidths increase it becomes increasingly difficult to distribute a sufficient number of decoupling capacitors 30 and the resulting impedance minima 32 throughout the entire video band in a manner that keeps video impedance sufficiently low, yet also achieves a sufficiently high impedance in the fundamental RF band. When impedance in the fundamental RF band is insufficiently high, amplifier efficiency suffers.

Furthermore, several different physical characteristics of an amplifier cause different nonlinearities, with the video-signal-induced nonlinearity being only one. Another form of nonlinearity is a memory effect, where an influence of the communication signal being amplified at one instant in time may be smeared over a considerable period. In essence, an amplifier acts in part like a collection of filters, or a complicated filter, with numerous undiscovered characteristics.

Conventional efforts aimed at expanding amplifier linearization techniques to include memory effects have found only marginal success. The difficulty associated with linearizing memory effects may result from the fact that conventional amplifiers appear to exhibit many different and distinct long term and short term memory effects cross correlated with one another but each having its own unique spectral characteristics and each contributing a different degree of distortion. The difficulty may have been exacerbated by the use of envelope trapping techniques, and exacerbated further by the use extensive envelope trapping techniques to address wider signal bandwidths, because each impedance minima may be responsible for a distinct memory effect.

One of the more successful conventional efforts at addressing memory effects results from the use of a Volterra model which characterizes the actual behavior of an amplifier, with a currently popular form of this approach being called a generalized memory polynomial (GMP) model. Unfortunately, due to numerous unknown terms, a considerable amount of cross correlation between the terms, and a large span of time over which different memory effects play out, a tremendous amount of power must be consumed to derive a system of equations that model the amplifier, then take the inverse of the system of equations, and implement that inverse system of equations in signal processing hardware. Consequently, this approach is generally viewed as being unacceptable for use in battery-powered transmitters. Moreover, the tremendous processing load of this approach usually dictates that compromises be made in loop bandwidths and in precision in modeling and inversing the amplifier transfer function.

Consequently, this approach typically has trouble following signal dynamics and in achieving high quality linearization results.

Another conventional effort at addressing amplifier nonlinearities, including both video-signal induced distortion and memory effects, is called envelope injection. Generally, signal processing circuits process the outgoing communication signal along with a feedback signal obtained from the output of the amplifier in an attempt to generate a baseband signal that is added to, or injected with, the amplifier biasing with the aim of canceling the video signal. But the video signal is a wideband signal that results from a complicated assortment of harmonic components acting on a component network of unknown and complicated impedance, in accordance with unknown nonlinear relationships. And, for cancellation techniques to be effective, cancellation signals should be very precisely generated. Only limited success has been achieved without employing an excessive amount of processing power to resolve the unknown parameters.

Accordingly, a need exists for a linearized transmitter and transmitter linearizing method that expand linearization efforts to address video-signal induced distortion and memory effects without employing an excessive amount of processing power.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a circuit diagram of a representative amplifier portion of a prior art RF transmitter;

FIG. 2 shows a representative chart of impedances presented to an amplifier over various frequency bands in a prior art transmitter;

DETAILED DESCRIPTION OF THE PREFERRED EMBODIMENTS

Figure 3:
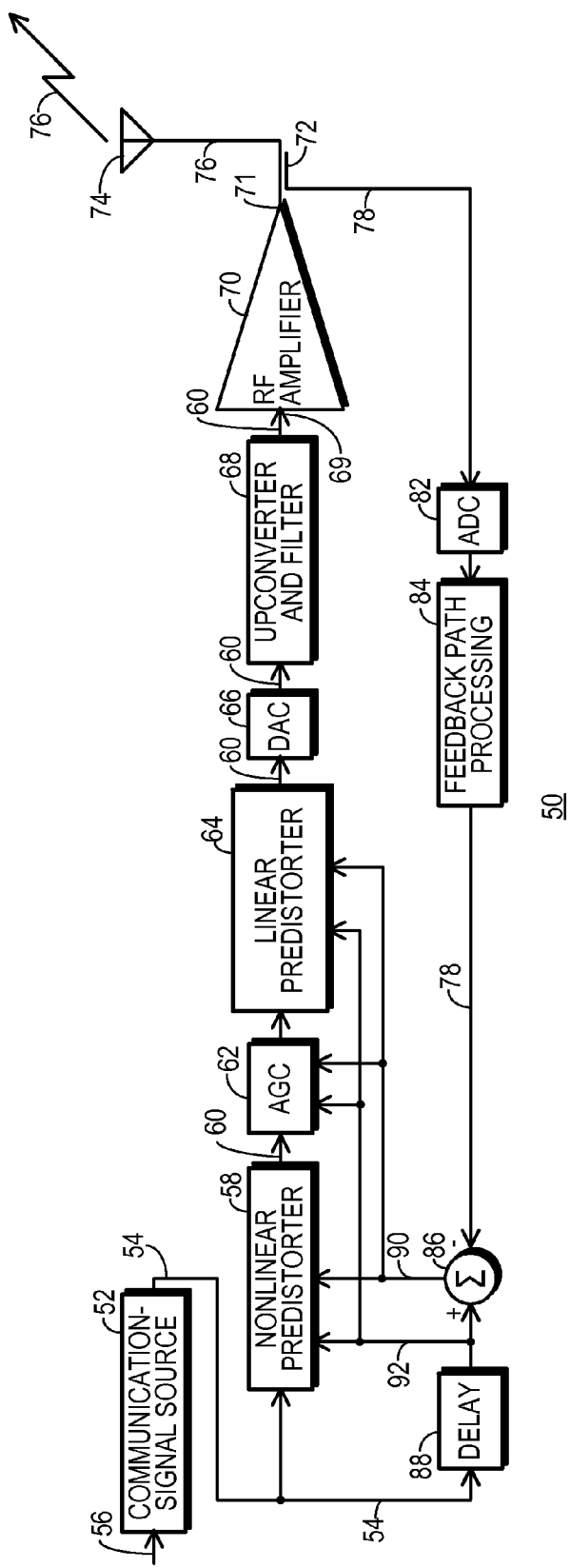
FIG. 3 shows a simplified block diagram of a transmitter configured in accordance with one embodiment of the present invention.

FIG. 3 shows a simplified block diagram of a transmitter 50 configured in accordance with the teaching of one embodiment of the present invention. In the embodiment explicitly depicted in the figures, transmitter 50 is configured to wirelessly transmit an RF communication signal. But those skilled in the art will appreciate that the present invention may also be used in other types of communication systems, including a communication system that transmits optical signals through an optical transmission medium, and in other applications, such as audio amplification.

Transmitter 50 includes a communication-signal source 52. Communication-signal source 52 provides a digitally modulated, complex, baseband version of a communication signal 54. A communication signal, such as communication signal 54 and others discussed below, is an electronic signal that may undergo a variety of different processing steps and be represented in a variety of different ways, including as one or more digital streams of data or as one or more analog signals. A communication signal has been modulated with information and/or data. The transmission of this information and/or data is the primary purpose of transmitter 50, and a communication signal could be demodulated or otherwise processed to recover the information and/or data.

Communication-signal source 52 may perform any number of activities well known to those skilled in the art of digital transmitters. For example, raw data to be transmitted from transmitter 50 may be digitally modulated using a suitable form of digital modulation, such as QPSK, CDMA, OFDM, or the like. Multiple data streams 56 may have been digitally modulated and combined together for transmission, as is common in a cellular base station, or a single data stream 56 may have been digitally modulated for transmission, as is common in an end-user's wireless device, such as a cell phone, laptop, netbook, electronic book, wireless network adapter, wireless router, and the like. The digitally modulated signal may have been pulse shaped to limit bandwidth while minimizing intersymbol interference (ISI). Additional processing may have been performed to reduce the peak-to-average power ratio. Any or all of these and other types of signal processing activities may be performed at communication-signal source 52.

As a result of the processing performed at communication-signal source 52, communication signal 54 is a baseband, digitally modulated, complex signal that exhibits a bandwidth roughly equal to the bandwidth allocated to transmitter 50 for the transmission of RF energy. This bandwidth resides at baseband (i.e., near DC). Desirably, communication signal 54 is an analytic signal having a bandwidth centered at or near 0 Hz.

Communication signal 54 drives a nonlinear predistorter 58. Nonlinear predistorter 58 spectrally processes communication signal 54 to intentionally introduce wide bandwidth distortion into the communication signal. This distortion is introduced upstream of an amplifier that will eventually amplify the communication signal, and it is configured to counteract distortion that the amplifier will impart to the version of the communication signal that it amplifies. This distortion extends over a bandwidth that exceeds the bandwidth of communication signal 54. Although not shown in FIG. 3, the sampling rate of communication signal 54 may be increased to accommodate the increased bandwidth. Nonlinear predistorter 58 converts the communication signal into a predistorted communication signal 60. Nonlinear predistorter 58 is discussed in more detail below in connection with FIGS. 4 and 8-12.

Predistorted communication signal 60 from nonlinear predistorter 58 drives an automatic gain control (AGC) section 62. In one embodiment, section 62 is implemented as a one-tap adaptive complex multiplier, where adaptation of the tap provides the automatic gain control function. Predistorted communication signal 60 from AGC section 62 then drives a linear predistorter 64.

At section 64 the communication signal is spectrally processed to introduce linear predistortion. The linear predistortion is desirably configured to compensate for linear distortion introduced downstream of linear predistorter 64. Predistorted communication signal 60 is presented at the output of linear predistorter 64 in a form that includes both linear and nonlinear predistortion.

Predistorted communication signal 60 propagates from linear predistorter 64 toward a digital-to-analog converter (DAC) 66. DAC 66 converts predistorted communication signal 60 into an analog signal that drives an upconverter and filter section 68. Section 68 frequency shifts predistorted communication signal 60, now in analog form, to the allocated RF fundamental frequency band for transmitter 50 and filters the frequency-shifted signal to pass only a desired sideband. Section 68 produces an RF form of the communication signal. Predistorted communication signal 60, now in RF form, is then fed to an input 69 of an amplifier 70. In one embodiment, amplifier 70 is a radio-frequency (RF) amplifier, or high-power amplifier (HPA), known to those of skill in the art of wireless communications.

In the embodiment depicted in FIG. 3, an output 71 of amplifier 70 couples through a directional coupler 72 to an antenna 74. Amplifier 70 amplifies the RF form of communication signal 60 to produce an amplified RF signal 76, which is broadcast from transmitter 50 at antenna 74. Desirably, the nonlinear and linear predistortion respectively introduced upstream through the operations of nonlinear predistorter 58 and linear predistorter 64 are of the correct character and composition to cancel distortions introduced downstream of DAC 66, and amplified RF signal 76 closely corresponds to a linear amplification of communication signal 54 provided by communication-signal source 52, but in analog form and shifted in frequency to the allocated frequency band for transmitter 50.

In order for the upstream predistortions to be of the correct character and composition to cancel distortions introduced downstream of DAC 66 it is desirable that amplified RF signal 76 be monitored and that the upstream predistortions be responsive to amplified RF signal 76. Accordingly, a tap-off port of directional coupler 72 extracts a small portion of amplified RF signal 76 for use as a feedback signal 78. Feedback signal 78 is routed through an analog-to-digital converter (ADC) 82, where it is then presented to a feedback path processing section 84. ADC 82 desirably operates at high speed and is phase coherent with the upconversion of section 68 so as to perform downconversion by digital subharmonic sampling. This form of downconversion is desirable because it lessens the corruption of feedback signal 78 that might occur if downconversion is performed through a more analog-intensive form of downconversion. But other forms of downconversion may also be used provided they introduce sufficiently low distortion into feedback signal 78.

Processing section 84 performs digital processing on feedback signal 78. In particular, processing section 84 desirably includes a Hilbert transformation to place feedback signal 78 in a complex, analytic signal form. And, processing section 84 may include a phase rotation to compensate for phase rotation introduced downstream of DAC 66, primarily in a band-pass filter portion of section 68, and a gain adjustment for the nominal linear HPA gain. Eventually, feedback signal 78, now in digital complex form, is supplied to a negative input of a subtraction circuit 86.

Communication signal 54 from communication-signal source 52 is also fed through a delay element 88 to a positive input of subtraction circuit 86. Although not shown, the sample rate of communication signal 54 may be increased prior to application at subtraction circuit 86 to accommodate the full bandwidth of feedback signal 78, which is wider than the bandwidth of communication signal 54. Delay element 88 is configured to temporally align communication signal 54 with feedback signal 78 at subtraction circuit 86. In other words, delay element 88 is configured so that a sample of communication signal 54 processed through a first path which includes delay element 88 and a second path that includes amplifier 70 and feedback path processing section 84 arrive at subtraction circuit 86 at the same time.

An output of subtraction circuit 86 generates an error signal 90 which describes the manner in which amplified RF signal 76 fails to be a linear amplification of communication signal 54. Error signal 90 and communication signal 54 configured in a delayed form 92 are each presented to control inputs of nonlinear predistorter 58, AGC section 62, and linear predistorter 64.

In one embodiment, linear predistorter 64 is implemented using an adaptive equalizer that adjusts equalizer coefficients in response to a least-means square (LMS) based control loop algorithm. The adaptive equalizer of linear predistorter 64 desirably estimates coefficient values for the taps of a finite impulse response (FIR) filter to influence the amount of linear distortion in amplified RF signal 76, then alters these coefficients over time to adjust the predistortion transformation function (transform) applied by the adaptive equalizer and to achieve decreasing amounts of linear distortion until convergence is reached at a minimum amount of linear distortion. The control loop trains linear predistorter 64 to reduce linear distortion in response to correlation between the conjugated form of error signal 90 and delayed communication signal 92. The control loop may be configured to adapt coefficients only during periods of substantially linear amplifier operation. Those skilled in the art may devise other forms of linear predistorters for use in transmitter 50.

In one embodiment, AGC circuit 62 also adjusts its complex tap coefficient in response to an LMS-based control loop algorithm. AGC circuit 62 implements an update algorithm similar to that of linear predistorter 64, except that only a single tap is adapted to normalize the gain applied by amplifier 70, directional coupler 72, and other components in the control loop. Those skilled in the art will appreciate that gain may be normalized by applying amplification or attenuation as may be needed to maintain a substantially constant gain value, such as one. And, the control loop algorithm for AGC circuit 62 may operate at a much faster loop bandwidth than that of linear predistorter 64. By operating at a much faster loop bandwidth, e.g., 10 KHz-100 KHz versus 10-200 Hz, some of the slower memory effect nonlinearities, such as thermal memory effects, may be tracked through AGC adaptation. Linear predistorter 64 may desirably operate at a lower loop bandwidth to conserve power consumption and to decouple its control loop from that of AGC section 62. To further isolate the control loop for AGC section 62 from other control loops operating in transmitter 50, AGC section 62 may desirably use a leaky integrator in its LMS-based continuous process adaptation control loop.

Figure 4:
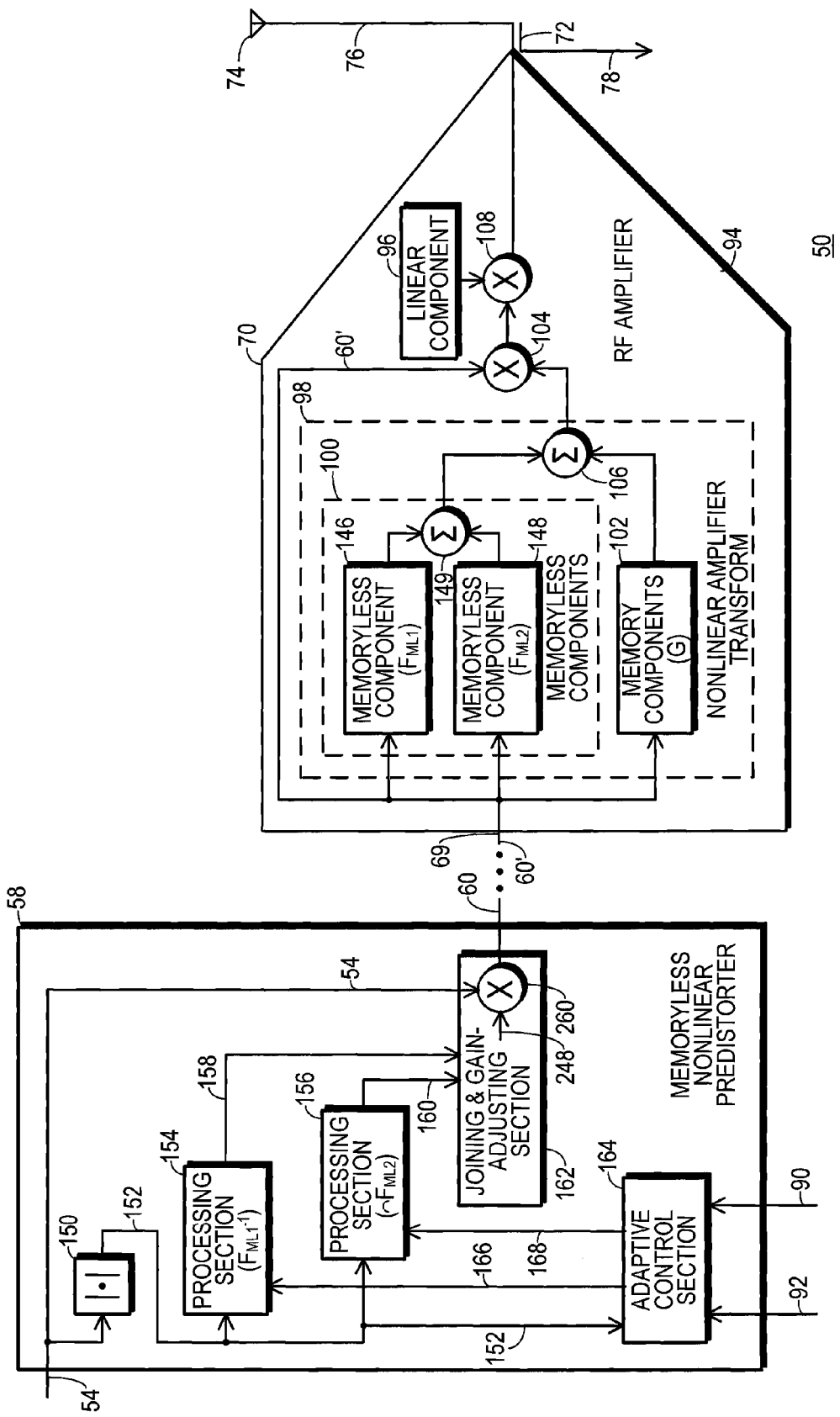
FIG. 4 shows a simplified block diagram of the transmitter of FIG. 3, with details shown concerning a first embodiment of a nonlinear predistorter portion of the transmitter.

FIG. 4 shows a simplified block diagram of transmitter 50 as discussed above and as shown in FIG. 3, but with details concerning a first embodiment of nonlinear predistorter 58 shown, with details of a behavioral model 94 for amplifier 70 shown, and with other details omitted.

The block diagram of model 94 presented in FIG. 4 provides an explanation for the way in which linear and nonlinear influences associated with amplifier 70 appear to behave. Those skilled in the art will appreciate that amplifier 70 is constructed from real components and materials that fail to operate precisely as desired. Accordingly, models, such as model 94, may be devised to explain the manner in which amplifier 70 appears to actually operate. The specific components of model 94 need not be individually observable in a real-world version of amplifier 70.

Model 94 depicts amplifier 70 as having its overall transfer function partitioned into a linear component 96 and a nonlinear component, referred to herein as a nonlinear amplifier transfer function and as a nonlinear amplifier transform 98. Linear component 96 describes the constant linear gain value ideally applied by amplifier 70. In other words, if amplifier 70 had a perfectly linear response, then amplified RF signal 76 would be accurately described by the multiplication of input signal 60' with constant value linear component 96. Input signal 60' is the communication signal formed from predistorted communication signal 60 provided at input 69 of amplifier 70. But amplifier 70 is not perfectly linear, and nonlinear amplifier transform 98 describes the manner in which it is not.

Model 94 indicates that nonlinear amplifier transform 98 is partitioned into two distinct types of nonlinear components. Each component is characterized as a distinct distortion in the gain applied by amplifier 70. The two types include memoryless components 100 and memory components 102.

Although not shown, memory components 102 may include any number of individual memory components coupled in parallel, with each memory component corresponding to a specific memory nonlinearity of amplifier 70. Memory components 102 include thermal nonlinearities, which may exhibit unknown corner or resonance frequencies in the 10 KHz-100 KHz range, and electrical nonlinearities, which typically exhibit unknown corner or resonance frequencies above 100 KHz. Thermal nonlinearities result from ambient-environment heating and self-heating in the active amplifying device used by amplifier 70. Electrical nonlinearities result from the use of energy storage devices, such as inductances and capacitances, in connection with processing the analog version of predistorted communication signal 60 within amplifier 70 and elsewhere in transmitter 50. Memory components 102 apply a transform labeled "G" in FIG. 4.

Memoryless components 100 are discussed in more detail below. RF input signal 60' drives each of components 100 and 102, as well as a multiplication element 104. The sum of signals output from components 100 and 102, as depicted at an addition element 106, represents a gain factor by which amplifier 70 multiplies communication signal 60. This gain factor is nonlinearly related to communication signal 60. This multiplication operation is depicted at multiplication element 104. Model 94 indicates that the output of multiplication element 104 and the output of linear component 96 drive respective multiplicand inputs of a multiplication element 108, with the output of multiplication element 108 providing the output from amplifier model 94. Although not specifically shown, the output of nonlinear amplifier transform 98 is normalized so that it's output from addition element 106 would always equal one if amplifier 70 were perfectly linear. This may be accomplished by attributing a linear gain of "1" along with nonlinear gain to memoryless component 146.

Those skilled in the art will appreciate that model 94 is configured primarily to characterize the influence of nonlinearities. A more complete model may reflect other considerations. The more complete model is not presented here because it is unnecessary to an understanding of the nonlinearities to which the below-discussed features of the preferred embodiments of the present invention are directed.

Figure 5:
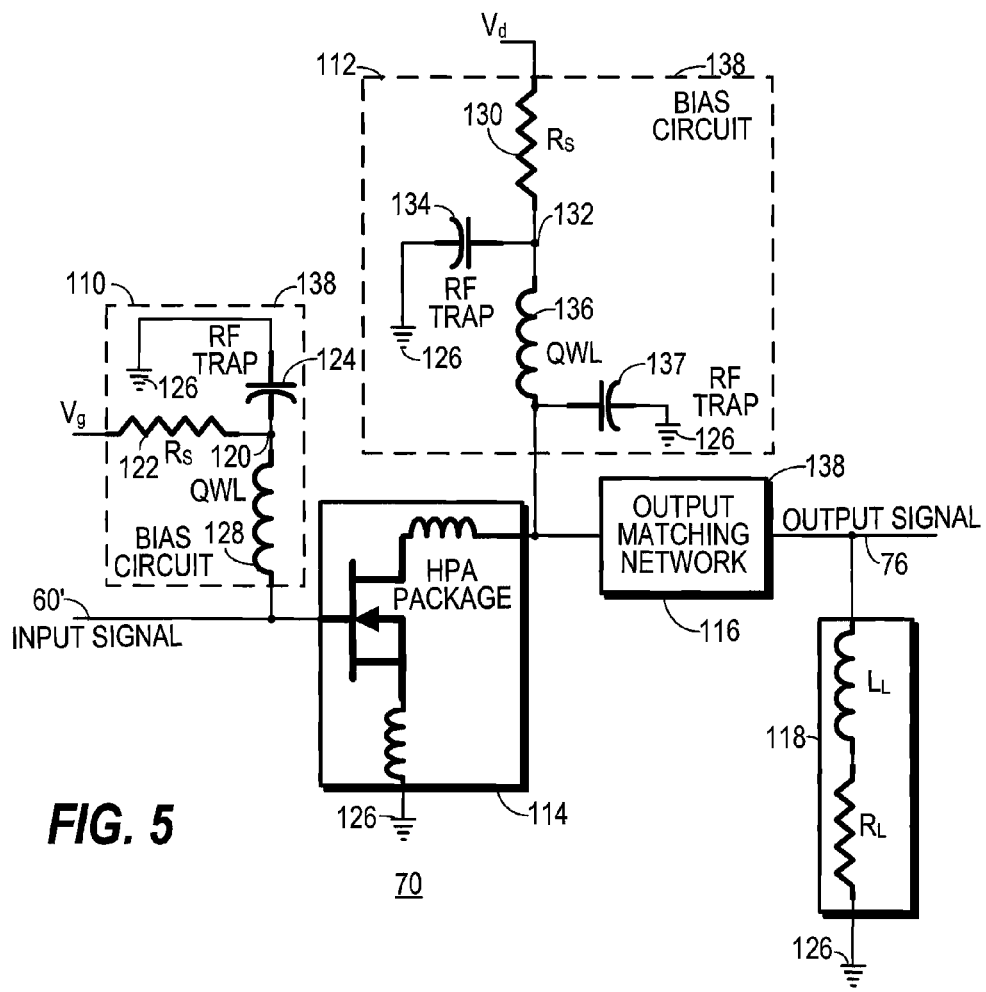
FIG. 5 shows a circuit diagram of a representative amplifier portion of the transmitter of FIG. 3.

FIG. 5 shows a circuit diagram of a representative amplifier 70. Transmitter 50 need not have an amplifier 70 configured precisely as depicted in FIG. 5, but many amplifiers which are suitable for use in transmitter 50 will include the basic blocks shown in FIG. 5, including an input bias circuit 110, an output bias circuit 112, a high power amplifier (HPA) package 114, an output matching network 116, and a load 118. For the purposes of discussing FIG. 5, HPA 114 refers to the active amplifying device or devices used by amplifier 70 to accomplish amplification when appropriately biased and matched.

RF input signal 60' is applied to input bias circuit 110 and to an input port of HPA 114. An input bias voltage, $V_g$, is also applied to input bias circuit 110. A source resistance 122 appears between a common node 120 within input bias circuit 110 and the input bias voltage $V_g$. A capacitance 124 appears between common node 120 and a ground potential 126, and an inductance 128, configured as a quarter wave transmission line for the RF fundamental band, appears between common node 120 and RF input signal 60'.

FIG. 5 depicts HPA 114 as a single MOS FET semiconductor device, but those skilled in the art will appreciate that other types of active devices and that multiple active devices coupled together may serve in the HPA role. In accordance with the particular MOS FET HPA device depicted in FIG. 5, a gate node of HPA 114 provides the input for HPA 114, a source node couples to ground potential 126, and a drain node provides the output for HPA 114. The drain node couples to output bias circuit 112 and to output matching network 116. As noted in FIG. 5, significant inductances are associated with internal HPA bondwires for the drain and source nodes.

An output bias voltage, $V_d$, is also applied to output bias circuit 112. A source resistance 130 appears between a common node 132 within output bias circuit 112 and the output bias voltage $V_d$. An inductance 136, configured as a quarter wave transmission line for the RF fundamental band, appears between common node 132 and the output of HPA 114. And, a capacitance 137 appears between the output of HPA 114 and ground potential 126.

Amplified RF signal 76 is provided across load 118, which appears across an output port of output matching network 116 and the common potential 126. Load 118 may be primarily resistive, and/or load 118 may also include a significant inductive component. A significantly inductive load may be present if a distributed active transformer (DAT) or similar component is used to couple multiple active devices to load 118. Collectively, input bias circuit 110, output bias circuit 112, output matching network 116, and load 118 provide a network of components 138 which couples to HPA 114.

In one embodiment, input and output bias voltages $V_g$ and $V_d$ are substantially constant DC voltages. A perfectly linear amplifier with constant DC bias voltages would operate at a constant bias condition. And, input signal 60' and the output signal from HPA 114 would then each consist of an RF fundamental signal combined with a DC component that corresponds to the constant bias condition.

But for real-world amplifier 70, nonlinearity, as described by nonlinear amplifier transform 98 (FIG. 4), causes a series of harmonics of the RF fundamental signal to be present as well. Even ordered harmonics generate near DC components, collectively referred to as a video signal. This video signal is present at least to some degree in input signal 60' and in the HPA 114 output signal. As a result, amplifier 70 operates at variety of bias conditions, where the variety of bias conditions are characterized as having an average bias condition and deviations away from the average bias condition, where the deviations correspond at least in part to the video signal.

Figure 6:
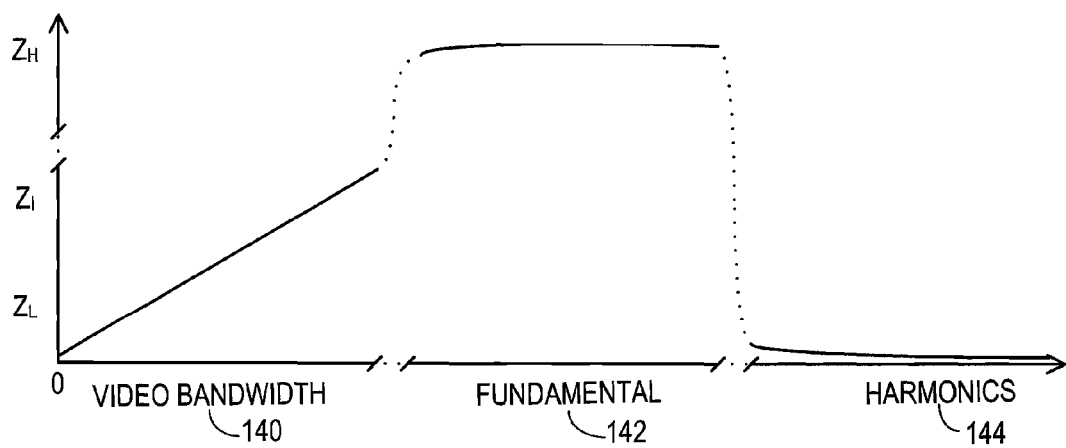
FIG. 6 shows a chart of representative impedances over various frequency bands presented to the active amplifying device of the amplifier portion of the transmitter of FIG. 3.

FIG. 6 shows a chart of representative impedances presented by bias circuits 110 and 112 over various frequency bands. In the preferred embodiment envelope trapping capacitors are omitted from amplifier 70. Consequently, throughout a video bandwidth 140 impedance increases monotonically with increasing frequency. But impedance need not increase monotonically and may also exhibit a region of substantially constant impedance with increasing frequency. Throughout video bandwidth 140, output matching network 116 and load 118 present a high impedance to HPA 114, so the increasing or constant impedance depicted in FIG. 6 also describes the impedance presented to HPA 114 for network of components 138 throughout video bandwidth 140.

Video bandwidth 140 represents the bandwidth of the video signal generated by applying nonlinear amplifier transform 98 to RF input signal 60'. Video bandwidth 140 exceeds a baseband bandwidth for communication signal 54 (FIG. 3), and for practical purposes, may be viewed as extending from DC to the maximum sampling rate supported by the digital processing sections within transmitter 50 (FIG. 3) that process different forms of the communication signal. At the higher end of video bandwidth 140, impedance may extend out of a low impedance range, $Z_L$, into an intermediate impedance range, $Z_I$. The impedance values and trajectory in video bandwidth 140 result from the primarily inductive nature in video bandwidth 140 of the network of components 138 and the bondwire inductances for HPA 114.

The MOS FET HPA 114 depicted in FIG. 5 is viewed as a transconductance device, where RF input signal 60' is expressed as a voltage and the output at the drain of HPA 114 is expressed as a current. Any video signal present at the input of HPA 114 adds to the voltage of RF input signal 60'. The output current passing through the drain of HPA 114, including any video signal that is present, passes through bias circuit 112, developing a voltage signal. For video bandwidth 140, the video current signal acts upon the video impedance depicted in FIG. 6 to form a video voltage signal. Since the drain-to-source ($V_{ds}$) bias voltage for HPA 114 represents $V_d$ minus any voltage signal developed across output bias circuit 112, the video signal causes $V_{ds}$ bias conditions for HPA 114 to deviate from the average condition to a degree defined by the video impedance.

In a fundamental RF band 142, the impedance presented to HPA 114 by bias circuits 110 and 112 is desirably as high as practical. Desirably, the impedance is much higher than the highest impedance exhibited in video bandwidth 140. This high impedance substantially blocks fundamental RF energy from flowing into bias circuits 110 and 112. Fundamental RF band 142 represents the RF bandwidth assigned to transmitter 50 and within which RF transmitter 50 transmits. It desirably has a bandwidth approximately equal to the bandwidth of baseband communication signal 54 generated by communication-signal source 52 (FIG. 3). The impedance values and trajectory in RF fundamental band 142 results primarily from the high impedance exhibited by quarter-wavelength inductive elements 128 and 136 along with RF trap capacitors 124 and 134 within RF fundamental band 142.

While bias circuits 110 and 112 desirably present a high impedance to HPA 114 within fundamental RF band 142, output matching network 116 and load 118 present a low impedance, causing the bulk of RF fundamental energy to flow through load 118. In an embodiment where load 118 has a significant inductive component, that low impedance may also exhibit a trajectory with constant or increasing impedance for increasing frequency, similar to the video impedance depicted in FIG. 6 for video bandwidth 140.

In a harmonics band 144, impedance is desirably as low as practical. The impedance values in harmonics band 144 result at least in part from RF trapping implemented using capacitance 137, which is configured to provide a resonance frequency at the second harmonic.

Referring to FIGS. 4-6, memoryless components 100 of model 94 describe nonlinearities whose distorting influence on amplified RF signal 76 is completely extinguished within a short period of time. Memoryless components 100 may also be called instantaneous or static components. To the extent that a memoryless nonlinearity exhibits any filtering effects, such filtering effects are characterized by resonance frequencies and/or corner frequencies outside video bandwidth 140. Conversely, memory components 102 of model 94 describe memory effect nonlinearities whose distorting influence on amplified RF signal 76 is smeared over a significant period of time. Memory components 102 may be characterized as a filter or complex of filters having resonance frequencies and/or corner frequencies within video bandwidth 140.

Another distinction between memoryless and memory components 100 and 102 is that parameters which accurately characterize memoryless components 100 may be determined using considerably less processing power than is expended determining parameters which accurately characterize memory components 102. Power is reduced, at least in part, because unknown temporal parameters associated with such resonance frequencies and/or corner frequencies need not be determined to accurately characterize memoryless nonlinearities.

By omitting envelope trapping capacitors from the network of components 138, processing power need not be expended resolving memory effect components associated with the video bandwidth 140 resonance frequencies such envelope trapping capacitors form. Network of components 138, without envelope trapping capacitors, has an inductive nature throughout video bandwidth 140, which evidences a filtering effect, and in particular a high-pass filtering effect. But the corner frequency of this high-pass filter is desirably located above video bandwidth 140. Consequently, network of components 138 is desirably configured as a high-pass filter operated as a differentiator within video bandwidth 140.

Model 94 in FIG. 4 indicates that memoryless components 100 include at least two distinct subcomponents. One subcomponent is referred to as an average gain-droop component 146, and the other is referred to as a inductive memoryless component 148. Average gain-droop component 146 applies a mathematical transform labeled $F_{ML1}$, while inductive memoryless component 148 applies a different mathematical transform, labeled $F_{ML2}$. $F_{ML1}$ and $F_{ML2}$ define the respective memoryless nonlinear functions of the magnitude of RF input signal 60' respectively applied at components 146 and 148. Model 94 shows outputs from components 146 and 148 being added together at an addition element 149, and their sum then describing a component of amplifier gain through the operation of addition element 106. As discussed below, this component of amplifier gain accounts for a majority of the nonlinear distortion exhibited by amplifier 70.

Figure 7:
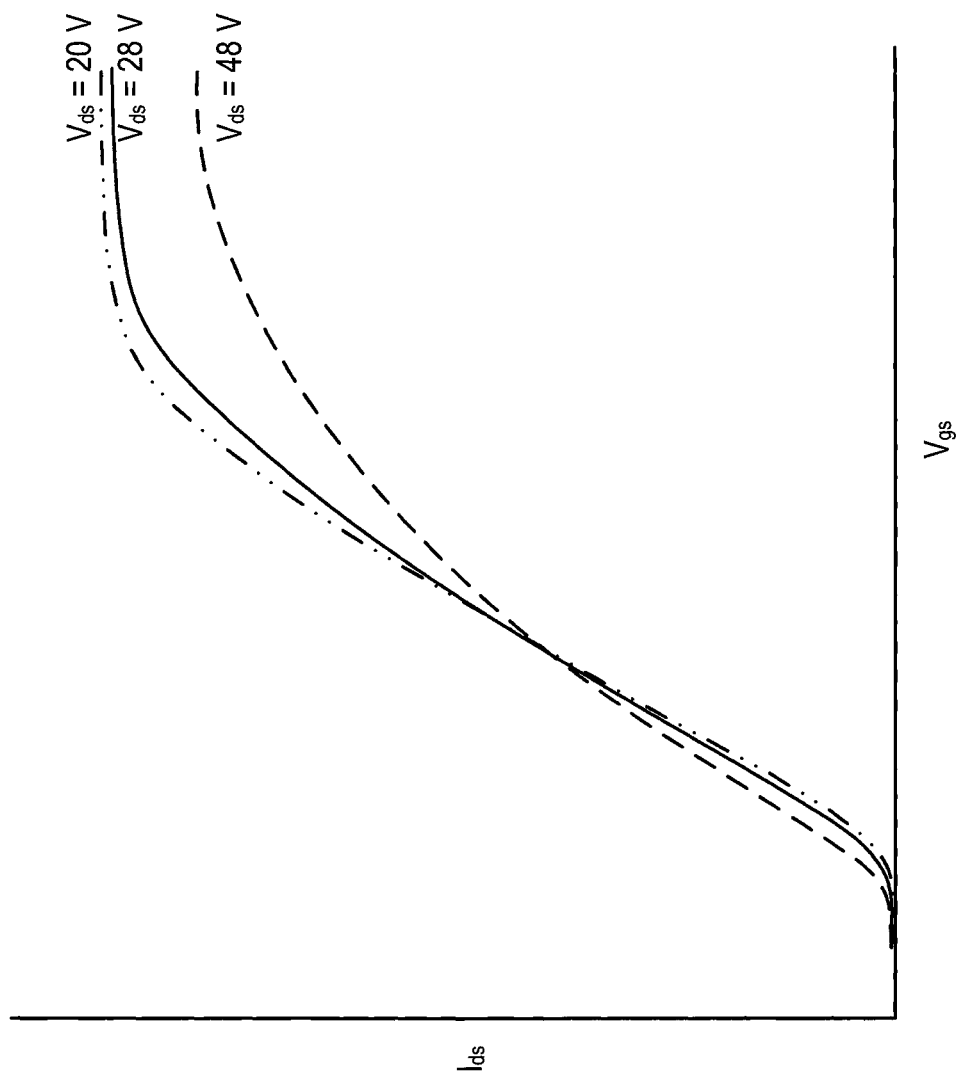
FIG. 7 shows a chart of representative gain curves for the active amplifier device of the amplifier portion of the transmitter of FIG. 3.

FIG. 7 shows a chart of representative transconductance gain curves for HPA 114 while experiencing an average influence within a range of memory effects, including thermal effects. The precise nature of the curve families will differ for different types of active devices which may serve as HPA 114, but certain features are common. In particular, two distinct types of nonlinearities are depicted.

One nonlinearity, which corresponds to average gain-droop component 146 (FIG. 4), is observed at each individual one of the curves shown in FIG. 7. At each single constant $V_{ds}$ bias condition, a nonlinear relationship exists between input signal gate-to-source voltage ($V_{gs}$) and output signal drain-to-source current ($I_{ds}$). Gain droops as $V_{gs}$ increases, and droops significantly at the higher end of the $V_{gs}$ range. This characterizes a nonlinear relationship that is a function of the magnitude of the input signal $V_{gs}$. This gain droop phenomenon is independent of any video signal effect because of the constant $V_{ds}$ bias condition. Likewise, for an average bias condition (e.g., $V_{ds}$=28 V) gain droop characterizes a nonlinearity that is independent of a video signal effect but a function of input signal magnitude. Moreover, this gain-droop phenomenon at any constant $V_{ds}$ or at an average $V_{ds}$ is a memoryless phenomenon because it results from the operation of HPA 114, which is not an energy storage device, such as an inductor or capacitor, when operated at a constant temperature.

Another nonlinearity, which corresponds to inductive memoryless component 148 (FIG. 4), is observed in connection with the differences between the individual curves shown in FIG. 7. The different curves have trajectories that differ in a variety of ways. For example, at the lower end of the input signal $V_{gs}$ range, moving from the $V_{ds}$=28 V curve to the $V_{ds}$=20 V results in reducing gain, but at the higher end of the input signal $V_{gs}$ range, moving from the $V_{ds}$=28 V curve to the $V_{ds}$=20 V results in increasing gain. Both the direction and the amount of gain changes resulting from operating at different $V_{ds}$ bias conditions are shown to be nonlinear functions of the input signal.

This video nonlinearity which is expressed in the different trajectories of the different curves shown in FIG. 7 is also a memoryless phenomenon because it results from the operation of HPA 114. But its influence is limited by the degree that the video signal causes bias conditions to deviate from an average bias condition, which is determined in part by the video impedance. To the extent that the video impedance remains memoryless by avoiding filter resonance and corner frequencies in video bandwidth 140, it remains a memoryless phenomenon.

This video memoryless nonlinearity component differs from the memoryless gain-droop nonlinearity component because it arises from different physical characteristics of amplifier 70. While gain-droop results from operating HPA 114 over a range of input signal magnitude at any constant bias condition or at an average bias condition, the video nonlinearity results from operating HPA 114 at a variety of different bias conditions, where the variety results at least in part from interaction between the video signal and the video bandwidth 140 impedance of the network of components 138 coupled to HPA 114.

Accordingly, FIG. 7 shows that HPA gain is partially explained as being a memoryless nonlinear function of RF input signal 60' even when bias conditions are constant. In other words, amplifier gain itself is modulated in response to input signal magnitude or envelope. And, when resonance and corner frequencies are avoided in video bandwidth 140, gain is also partially explained as being a different memoryless nonlinear function of RF input signal 60' as bias conditions deviate from an average bias condition. In other words, gain is also modulated by envelope-induced deviations from an average bias condition. Between the two nonlinearities, gain-droop component 146 exerts a far greater influence on the overall gain of amplifier 70 than inductive memoryless component 148.

In an embodiment of amplifier 70 in which load 118 (FIG. 5) includes a significant inductive component, amplifier 70 may exhibit another memoryless nonlinearity that behaves similar to inductive memoryless component 148, but has a different physical basis. In particular, nonlinear amplifier transform 98 generates odd-ordered harmonics of RF input signal 60' as well as the above-discussed even-ordered harmonics that cause the video signal. The odd-ordered harmonics include components that fall in and near fundamental frequency band 142 (FIG. 6) as well as components that fall in harmonics band 144 (FIG. 6). These odd-ordered harmonic fundamental components may then act upon the inductive load, having a constant or increasing impedance with increasing frequency within fundamental band 142, in a substantially memoryless fashion, as described above for the video signal. While the below-presented discussion is primarily directed to nonlinear consequences of the video signal, it may likewise apply to odd-ordered harmonic fundamental components that act on a significantly inductive load 118.

FIG. 4 depicts a first embodiment of nonlinear predistorter 58 configured as a memoryless nonlinear predistorter. In particular, this memoryless embodiment of predistorter 58 crafts gain predistortions and applies these gain predistortions to communication signal 54. The gain predistortions crafted in predistorter 58 counteract the gain distortions imposed by memoryless components 146 and 148. In this embodiment, memory components 102 are desirably ignored by predistorter 58. In particular, thermal memory effects are assumed to impose such a small amount of distortion that they may be ignored altogether and/or are imposed so slowly that they may be compensated by the gain adjusting function of AGC section 62 (FIG. 3). Electrical memory effects have been significantly minimized by removing resonance frequencies from the video bandwidth 140 impedance presented to HPA 114 by network of components 138 (FIG. 5). Remaining electrical memory effects are assumed to impose such a small amount of distortion that they may be ignored altogether.

Predistorter 58 includes a magnitude-extracting section 150 which extracts a magnitude parameter from communication signal 54, forming a magnitude signal 152. In the preferred embodiment, the magnitude parameter obtained in section 150 is the pure mathematical magnitude of the complex communication signal 54, but other embodiments may extract other magnitude parameters, such as magnitude squared.

Magnitude signal 152 passes to a processing section 154 and to a processing section 156. Processing section 154 is configured to implement an inverse transform to the $F_{ML1}$ transform applied by memoryless component 146, i.e., $F_{ML1}^{-1}$. Processing section 154 generates a gain-correcting signal 158 that represents the inverse of the gain-modulating signal generated by memoryless component 146 of model 94. Thus, processing section 154 applies an inversing transform $F_{ML1}^{-1}$ that is responsive to gain droop for an average bias condition, average temperature, and an average of all memory effects.

Those skilled in the art will appreciate that precise mathematical averages or means are not explicitly required in identifying the average behavior for bias conditions, temperature deviations, and memory effects. Rather the average refers to, for each possible single value of communication signal 54, a single value that summarizes or represents the general significance of the set of all values that gain droop exhibits over a tracking period for that value of communication signal 54. And, the averages may be determined implicitly rather than explicitly.

The determination of inversing transform $F_{ML1}^{-1}$ is discussed in more detail below in connection with FIG. 8. In general, inversing transform $F_{ML1}^{-1}$ may be established using an LMS-based control loop that updates a look-up table (LUT). This LMS-based control loop is desirably configured to exhibit stable, low-noise, low-jitter values for the LUT. The loop bandwidth may be greater or lower than the corresponding update loop bandwidth for linear predistorter 64 (FIG. 3), but is desirably much lower than the update loop bandwidth for AGC section 62 (FIG. 3). In other words, a slow loop bandwidth is desirably used, this slow loop bandwidth establishes the tracking period over which gain droop is evaluated, and by evaluating gain droop over this lengthy tracking period the above-discussed averages are implicitly established.

Processing section 156 is configured to implement a transform corresponding to the $F_{ML2}$ transform applied by inductive memoryless component 148, i.e., $\cap F_{ML2}$. As discussed below, the $\cap F_{ML2}$ transform may correspond to the $F_{ML2}$ transform in more than one way. Processing section 156 generates a gain-correcting signal 160 that represents the gain-modulating signal generated by inductive memoryless component 148 of model 94. Thus, processing section 156 applies a transform $\cap F_{ML2}$ that is desirably substantially unresponsive to average bias conditions, but desirably responsive to the gain modulation exhibited by amplifier 70 as bias conditions deviate from the average bias conditions. As explained above, bias conditions deviate from the average bias conditions at least in part due to amplifier 70 applying nonlinear amplifier transform 98 to RF input signal 60', causing even-ordered harmonics which, along with the video impedance of network of components 138, are responsible for the video signal which defines the deviations.

Gain-correcting signals 158 and 160 are each configured to address different components of gain distortion in amplifier 70. And, gain-correcting signals 158 and 160 are contemporaneous with one another. In other words, signals 158 and 160 are respectively generated by processing sections 154 and 156 in parallel or at the same time, and each of signals 158 and 160 is desirably capable of exerting an influence on predistorted communication signal 60 during each sample of communication signal 54. Moreover, since gain-correcting signals 158 and 160 are directed to memoryless phenomena, processing sections 154 and 156 may be implemented and updated while consuming only a small amount of power.

Gain-correcting signals 158 and 160 and communication signal 54 pass to a joining and gain adjusting section 162. In general, joining and gain adjusting section 162 joins gain-correcting signals 158 and 160 together into a combined gain-correcting signal 248 that substantially exhibits an inverse behavior with respect to signal magnitude to the behavior of the signal provided by addition element 149 in model 94 for amplifier 70. And, joining and gain adjusting section 162 applies gain to communications signal 54, including amplification and/or attenuation, in a manner defined by the combined gain-correcting signal. Joining and gain-adjusting section 162 is discussed in more detail below in connection with FIGS. 10-11.

Nonlinear predistorter 58 also includes an adaptive control section 164. Adaptive control section 164 receives magnitude signal 152, error signal 90, and delayed communication signal 92 as inputs. These input signals are used to generate update signals 166 and 168 respectively provided to processing sections 154 and 156. Update signals 166 and 168 train and maintain processing sections 154 and 156 to define the $F_{ML1}^{-1}$ and $\cap F_{ML2}$ transforms they apply to a magnitude parameter of communication signal 54. Portions of adaptive control section 164 are discussed below in connection with FIGS. 8-9.

Figure 8:
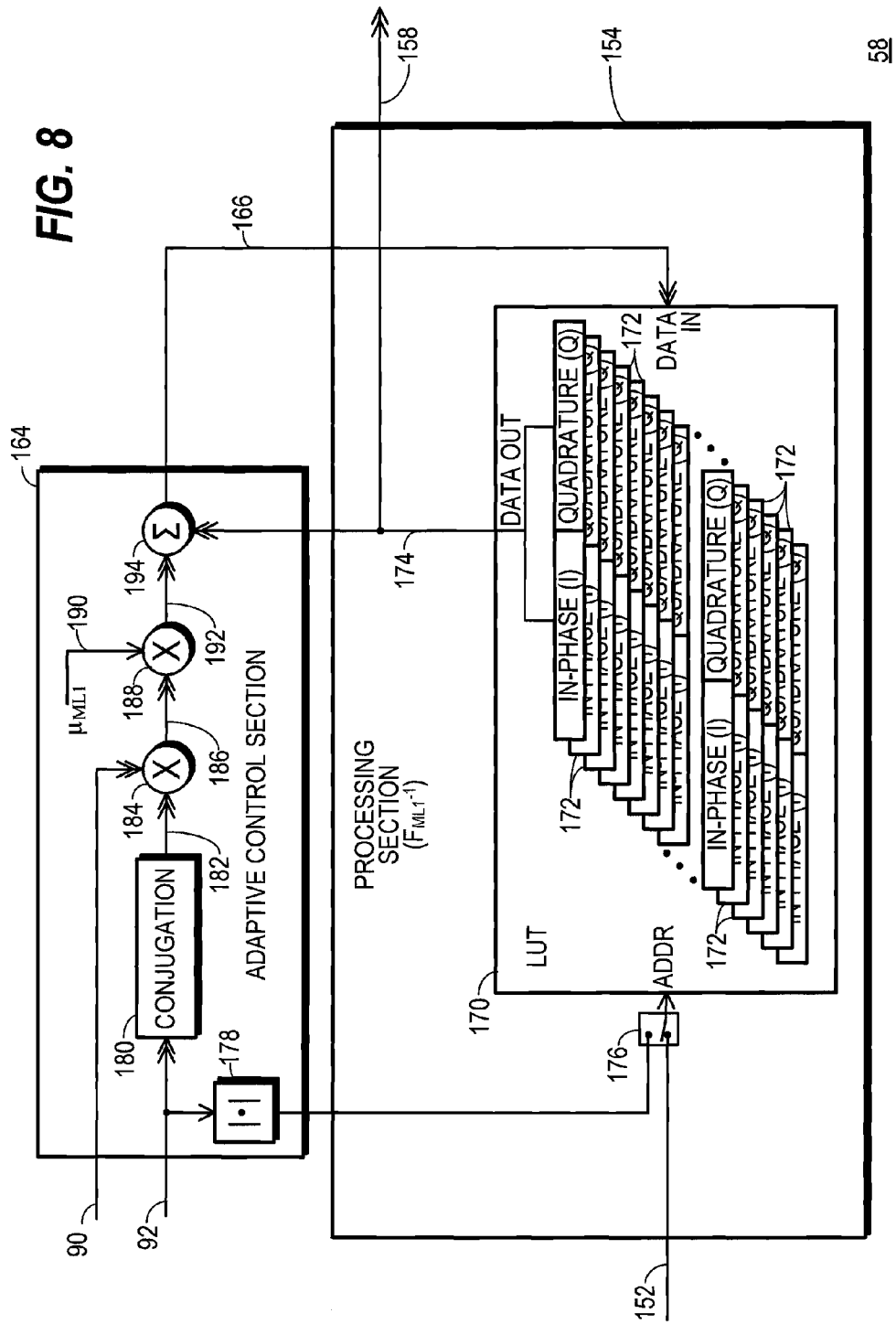
FIG. 8 shows a block diagram of an average-droop processing section and a portion of an adaptive control section of the nonlinear predistorter depicted in FIG. 4.

FIG. 8 shows a block diagram of processing section 154 and a portion of adaptive control section 164 from the memoryless nonlinear predistorter 58 depicted in FIG. 4. In FIG. 8, the complex nature of the communication signals processed in nonlinear predistorter 58 is specifically denoted with a double-arrowhead notation.

Processing section 154 desirably implements a form of gain-based predistortion that uses a look-up table (LUT) 170. Desirably, LUT 170 is organized to include a multiplicity of data entries 172, with different data entries 172 corresponding to different magnitude values that may be presented to the address input of LUT 170. Each data entry is desirably configured as a complex value having in-phase and quadrature components. During each look-up operation, the addressed data entry 172 is provided at a data output of LUT 170 and referred to herein as an outgoing data entry 174.

A mode switch 176 signifies that processing section 154 may operate in two different modes. Those skilled in the art will appreciate that no actual switch is required but that switch 176 is depicted to indicate two different operations that take place with respect to LUT 170. For example, if LUT 170 is implemented using a dual-port memory device then both operations may take place simultaneously from the perspective of circuits outside of LUT 170. One mode is a normal mode, during which processing section 154 applies its $F_{ML1}^{-1}$ transform to magnitude signal 152 in order to generate gain-correcting signal 158. The other mode is an update mode, during which processing 154 updates one of its data entries. During a normal mode of operation LUT 170 is addressed by magnitude signal 152. For each sample, the magnitude value is translated into a complex gain value by LUT 170, and the outgoing data entry 174 that defines the complex gain value forms a sample of gain-correcting signal 158. Although not shown, a section may be included at the output of processing section 154 to force gain-correcting signal 158 to generate a stream of a constant, normalized value, such as [0,0] or [0,1], when processing section 156 is being updated to reduce cross-coupling between processing sections 154 and 156.

During the update mode, data entries 172 for LUT 170 are calculated by adaptive control section 164, which implements a control loop that processes amplified RF signal 76 as expressed in error signal 90. In one embodiment (not shown), adaptive control section 164 implements a conventional least-means-squared (LMS) algorithm. In this embodiment, adaptive control section 164 performs conversions between Cartesian and polar coordinate systems in making its calculations. Alternatively, adaptive control section 164 may implement a conventional LMS algorithm using the secant method, which requires the performance of division operations.

FIG. 8 depicts a preferred embodiment in which adaptive control section 164 implements a modified LMS algorithm. In the modified LMS algorithm of the FIG. 8 embodiment, a conventional LMS algorithm has been modified in a way that avoids the use of conversions between Cartesian and polar coordinate systems and also avoids division operations.

Referring to FIG. 8, from the perspective of an update operation, or write cycle for LUT 170, a communication signal is applied to control section 164 at a magnitude-extracting section 178. Desirably, magnitude-extracting section 178 performs the same function as is performed by magnitude-extracting section 150. For the update operation, this communication signal is a delayed version of communication signal 54, such as delayed communication signal 92. In an alternate embodiment, magnitude-extracting section 178 may be omitted, and the output of magnitude-extracting section 150, appropriately delayed, used in lieu of section 178. The magnitude signal output from section 178 addresses LUT 170 through mode switch 176. It is simply a delayed version of magnitude signal 152.

Communication signal 92 is also provided to a conjugation section 180. Conjugation section 180 implements a conjugation operation, which in the Cartesian coordinate system can be performed by negating the imaginary component of each complex sample. Conjugation section 180 provides a conjugated communication signal 182 that is responsive to communication signal 92. Conjugated communication signal 182 drives a first input of a multiplier 184.

Error signal 90 (also shown in FIGS. 3-4) drives a second input of multiplier 184. Although not shown, additional delay may be inserted upstream of multiplier 184 as necessary so that corresponding samples from conjugated communication signal 182 and error signal 90 are aligned in time at multiplier 184.

As shown in FIG. 3 and discussed above, error signal 90 is responsive to amplified RF signal 76 through feedback signal 78. In particular, error signal 90 is responsive to a difference between delayed communication signal 92 and amplified RF signal 76, as expressed through feedback signal 78. This generally represents the portion of amplified RF signal 76 (FIG. 3) that differs from its ideal configuration. Error signal 90 allows the control loop to converge where LUT 170 accurately implements approximately the inverse of the $F_{ML1}$ transform applied by gain-droop memoryless component 146. Multiplier 184 correlates conjugated communication signal 182 with error signal 90 to produce a raw correlation signal 186. Multiplier 184 desirably performs its complex multiplication operation using the Cartesian coordinate system.

Raw correlation signal 186 is received at a two-quadrant complex multiplier 188 along with a scaling or loop-control constant 190, which is labeled using the variable "$\mu_{ML1}$" in FIG. 8. An output from multiplier 188 generates a scaled correlation signal 192. In the preferred embodiment, multiplier 188 is implemented using the Cartesian coordinate system.

Scaling constant 190 determines how much influence each sample from raw correlation signal 186 will exert on an updated data entry 172 for LUT 170. Greater influence is associated with faster but less stable convergence for LUT 170, more noise represented in data entries 172 of LUT 170, and a faster loop bandwidth for the control loop that updates data entries 172. Scaling constant 190 is desirably chosen to implement a relatively narrow loop bandwidth. This loop bandwidth establishes the tracking period over which gain-droop memoryless component 146 of amplifier model 94 (FIG. 4) is measured. Thus, this tracking period discussed above in connection with memoryless component 146 is relatively slow so that influences of memoryless component 148 and memory components 102 (FIG. 4) occur on a faster time scale and so that the updating of data entries 172 remains substantially unresponsive to these other nonlinearity influences.

However, scaling constant 190 need not be completely time invariant. For example, a faster loop bandwidth may be initially chosen to quickly populate LUT 170 with data entries 172, then the loop bandwidth may be slowed. And, scaling constant 190 may be set to zero for extended periods when desirable to prevent data entries 172 from changing. For example, scaling constant 190 may be set to zero while transmitter 50 is not actively transmitting, and scaling constant 190 may be set to zero while other control loops within transmitter 50 are converging.

Scaled correlation signal 192 drives a positive input of a combiner 194. A negative input of combiner 194 receives outgoing data entries 174 from LUT 170. For each sample of scaled correlation signal 192, the outgoing data entry 174 provided to combiner 194 from LUT 170 corresponds to the sample of communication signal 92 to which the scaled correlation signal 192 sample also corresponds. A magnitude parameter for that sample from communication signal 92 serves as an address to LUT 170 to cause LUT 170 to produce the corresponding data entry 174.

Desirably, combiner 194 performs a Cartesian coordinate system addition operation. An output of combiner 194 couples to a data input port of LUT 170 and provides incoming data entries through update signal 166 for storage in LUT 170. Each incoming data entry is stored at the same memory address from which the corresponding outgoing data entry 174 was previously stored. The incoming data entry carried by update signal 166 is expressed in the Cartesian coordinate system.

Accordingly, adaptive control section 164 applies an update equation to error signal 90, delayed communication signal 92, and outgoing data entries 172 addressed by a delayed magnitude signal. When the control loop converges, processing section 154 implements transform $F_{ML1}^{-1}$, which approximates the inverse of the $F_{ML1}$ transform applied by memoryless component 146 of model 94.

Figure 9:
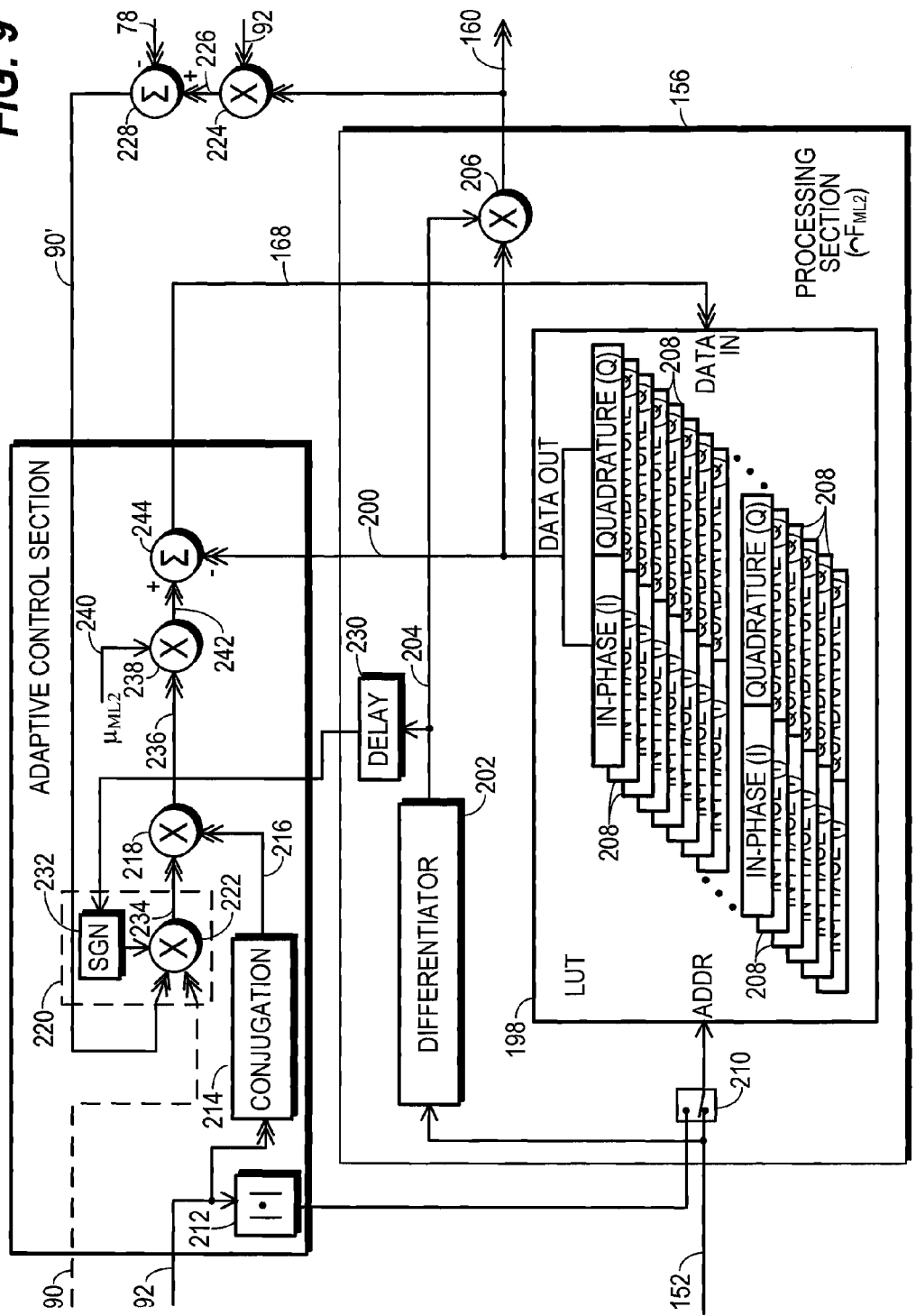
FIG. 9 shows a block diagram of a video processing section and a portion of an adaptive control section of the nonlinear predistorter depicted in FIG. 4.

FIG. 9 shows a block diagram of processing section 156 and a portion of adaptive control section 164 from the memoryless nonlinear predistorter 58 depicted in FIG. 4. In FIG. 9, the complex nature of the communication signals processed in nonlinear predistorter 58 is specifically denoted with the double-arrowhead notation.

Like processing section 154 discussed above, processing section 156 desirably implements a form of gain-based predistortion that uses a look-up table (LUT), labeled LUT 198. But the transform being implemented by processing 154 was dictated by memoryless gain-droop of HPA 114. While the relationship is nonlinear, gain-droop is fairly well characterized considering signal magnitude alone, and without considering other circuit components. Unlike processing section 154, processing section 156 applies a transform $\cap F_{ML2}$ dictated by network of components 138 (FIG. 5) as well as HPA 114. And, while memory component 148 transform $F_{ML2}$ is a function of signal magnitude, it is a more complex function.

The above-discussed video signal that is responsible for video memoryless component 148 is generated by even harmonics of the input signal. Accordingly, the video current signal generated by these even harmonics at the drain of HPA 114 may be modeled as an instantaneous nonlinear current generator that implements some unspecified nonlinear polynomial function of the magnitude signal, and more specifically a collection of powers of the magnitude signal. This represents a first nonlinear function to be attributed to HPA 114. It is largely accounted for by gain droop, without considering envelope-induced bias modulation.

The video signal then acts upon the video impedance (FIG. 6) of network of components 138. As discussed above, this video impedance resembles a high pass filter that functions as a differentiator because it's corner frequency is above video bandwidth 140 (FIG. 6). Those skilled in the art will appreciate that a differentiator is a circuit whose output is proportional to the derivative of its input with respect to time. The video current signal may be modeled as acting upon a differentiator to produce a video voltage signal. And, when the voltage video signal is viewed as causing deviations from the average bias conditions, HPA 114 imparts a second HPA nonlinearity which defines a voltage-to-gain conversion resulting from these bias condition deviations, as depicted in FIG. 7.

LUT 198 is a polynomial generator that produces a polynomial signal 200 which corresponds to the above-discussed nonlinear current generator and voltage-to-gain conversion. A differentiator 202 has an input driven by magnitude signal 152. Differentiator 202 models the application of the video current signal upon the video impedance of network of components 138 in a generic fashion. Differentiator 202 is desirably configured to provide a reasonably accurate derivative over half of video bandwidth 140. Differentiator 202 may be implemented using a FIR, IIR, or other architecture in a manner understood to those of skill in the art. An output of differentiator 202 provides a derivative signal 204 which drives a first input of a multiplier 206. Polynomial signal 200 drives a second input of multiplier 206. An output of multiplier 206 provides gain-correcting signal 160. Together, the polynomial generator of LUT 198 and differentiator 202 provide transform $\cap F_{ML2}$ when LUT 198 has been updated.

Desirably, LUT 198 is organized to include a multiplicity of data entries 208, with different data entries 208 corresponding to different magnitude values that may be presented to the address input of LUT 198. Each data entry 208 is desirably configured as a complex value having in-phase and quadrature components. During each look-up operation, the addressed data entry 208 is provided at a data output of LUT 198 and referred to herein as a sample of polynomial signal 200.

A mode switch 210 signifies that processing section 156 may operate in two different modes. Those skilled in the art will appreciate that no actual switch is required but that switch 210 is depicted to indicate two different operations that take place with respect to LUT 198. LUT 198 may be implemented using a dual-port memory device so that both operations may take place simultaneously from the perspective of circuits outside of LUT 198. One mode is the normal mode, during which processing section 156 applies its $\cap F_{ML2}$ transform to magnitude signal 152 in order to generate gain-correcting signal 160. The other mode is the update mode, during which processing section 156 updates one of its data entries 208. Desirably, processing sections 154 and 156 operate in their normal modes contemporaneously, but sections 154 and 156 need not, and preferably do not, operate in their update modes contemporaneously. During the normal mode of operation, LUT 198 is addressed by magnitude signal 152. For each sample, the magnitude value is translated into a complex gain value by LUT 198 which serves as a sample of polynomial signal 200. The product of a sample from derivative signal 204 and the sample of polynomial signal 200 forms a sample of gain-correcting signal 160. Although not shown, a section may also be included at the output of processing section 156 to force gain-correcting signal 160 to generate a stream of a constant, normalized value, such as [0,0], when one or both of processing sections 154 and 156 are being updated to reduce cross-coupling between processing sections 154 and 156 or to prevent gain-correcting signal 160 from influencing amplified RF signal 76 (FIGS. 3-4) as it is being updated.

During the update mode, data entries 208 for LUT 198 are calculated by adaptive control section 164, which implements a control loop that processes amplified RF signal 76. For LUT 198 control section 164 applies a different update equation than is used to update LUT 170 (FIG. 8). FIG. 9 depicts a preferred embodiment in which adaptive control section 164 implements a modified LMS algorithm. In the modified LMS algorithm of the FIG. 9 embodiment, a conventional LMS algorithm has been modified to neutralize an zero expectation effect of derivative signal 204 (derivative signal 204 exhibits an average value of zero) that would otherwise prevent a DC gradient from forming to drive the LMS algorithm.

Referring to FIG. 9, from the perspective of an update operation, or write cycle for LUT 198, a communication signal is applied to control section 164 at a magnitude-extracting section 212. Desirably, magnitude-extracting section 178 performs the same function as is performed by magnitude-extracting section 150. For the update operation, this communication signal is a delayed version of communication signal 54, such as delayed communication signal 92. The magnitude signal output from section 212 addresses LUT 198 through mode switch 210. It is simply a delayed version of magnitude signal 152.

Communication signal 92 is also provided to a conjugation section 214. Conjugation section 214 implements a conjugation operation. Conjugation section 214 provides a conjugated communication signal 216 responsive to communication signal 92. Conjugated communication signal 216 drives a first input of a multiplier 218.

FIG. 9 depicts two different embodiments for two different update equations that may be implemented by adaptive control section 164 in updating LUT 198. In one embodiment, in which the parallel combination of processing sections 154 and 156 directly provide a transform which approximates the inverse of the parallel combination of memoryless components 146 and 148, error signal 90 (also shown in FIGS. 3-4 and 8) drives a first input of a derivative neutralizer 220, and more particularly a first input of a multiplier 222 within derivative neutralizer 220. FIG. 9 depicts this embodiment by the use of a dotted line to symbolize the application of error signal 90 to derivative neutralizer 220.

In an alternate embodiment, processing section 156 is updated so that transform $\cap F_{ML2}$ corresponds to transform $F_{ML2}$ of inductive memoryless component 148 by closely approximating transform $F_{ML2}$. In this embodiment, gain-correcting signal 160 and an appropriately delayed version of the communication signal, such as communication signal 92, drive respective multiplicand inputs of a multiplier 224 to generate a communication signal 226 whose gain has been altered to reflect only the estimated component of total gain modulation due to the video signal influence on bias conditions. Communication signal 226 drives a positive input of a combiner 228, and a form of feedback signal 78 (FIG. 3) output from feedback path processing section 84 (FIG. 3) couples to a negative input of combiner 228. Combiner 228 provides an error signal 90' that drives the first input of derivative neutralizer 220 in this alternate embodiment in lieu of error signal 90 used in the first embodiment.

Each of error signals 90 and 90' are responsive to amplified RF signal 76 through feedback signal 78. In particular, error signal 90 is responsive to a difference between delayed communication signal 92 and amplified RF signal 76. Alternate error signal 90' is responsive to a communication signal whose gain has been altered by the current estimate of $F_{ML2}$ and amplified RF signal 76. Error signal 90 generally represents the portion of amplified RF signal 76 (FIG. 3) that differs from its ideal configuration, and alternate error signal 90' generally represents the portion of amplified RF signal 76 that differs from the ideal configuration modified only by the current estimate of $F_{ML2}$. Error signals 90 and 90' allow the control loop to converge where LUT 198 accurately implements a transform that corresponds to the $F_{ML2}$ transform applied by memoryless component 148 (FIG. 4).

Derivative signal 204 is delayed in a delay element 230 and then applied to a second input of derivative neutralizer 220 at a sign section 232. Within derivative neutralizer 220, an output of sign section 232 couples to a second input of multiplier 222. An output of multiplier 222 serves as the output for derivative neutralizer 220 and provides a DC-offset enhanced error signal 234.

Derivative signal 204 has no DC component. It exhibits a relatively short-term average value of zero. It roughly describes the slope of magnitude signal 152, which must be positive as much as it is negative since magnitude signal 152 is permanently confined within a fixed magnitude range. The same derivative effect may be attributed to the video voltage signal which is responsible for bias condition deviations experienced by HPA 114 (FIG. 5) because it is formed from a video current signal acting upon a high pass filter functioning as a differentiator, as discussed above. Since derivative signal 204 is proportional to gain-correcting signal 160 and since the derivative-generated video voltage signal modulates gain in HPA 114, no long-term DC components can be present in either of error signals 90 or 90'. In order to compensate for this derivative effect, derivative neutralizer 220 multiplies the error signal 90 or 90' by a function that is negative when derivative signal 204 is negative. The inverse of the derivative signal 204 would be ideal for use as this function, but taking inverses is computationally complex and consumes a considerable amount of power. The sign function of section 232 is nevertheless preferred because it is far simpler and consumes very little power while imposing very little cost in convergence. DC-offset enhanced error signal 234 drives a second input of multiplier 218.

Multiplier 218 correlates conjugated communication signal 216 with DC-offset enhanced error signal 234 to produce a raw correlation signal 236. Raw correlation signal 236 is received at a two-quadrant complex multiplier 238 along with a scaling or loop-control constant 240, which is labeled using the variable "$\mu_{ML2}$" in FIG. 9. An output from multiplier 238 generates a scaled correlation signal 242. Scaling constant 240 operates in a manner similar to scaling constant 190 (FIG. 8) discussed above to determine how much influence each sample of raw correlation signal 236 will exert on an updated data entry 208 for LUT 198. Scaling constant 240 is desirably chosen to implement a relatively narrow loop bandwidth.

Scaled correlation signal 242 drives a positive input of a combiner 244. A negative input of combiner 244 receives polynomial signal 200 from LUT 198. For each sample of scaled correlation signal 242 and each corresponding sample from polynomial signal 200 provided to combiner 244 from LUT 198 corresponds to the sample of communication signal 92 to which the scaled correlation signal 242 sample also corresponds. A magnitude parameter for that sample from communication signal 92 serves as an address to LUT 198 to cause LUT 198 to produce the corresponding data entry 208.

An output of combiner 244 couples to a data input port of LUT 198 and provides incoming data entries through update signal 168 for storage in LUT 198. Each incoming data entry is stored at the same memory address from which the corresponding sample of polynomial signal 200 was previously stored.

Accordingly, adaptive control section 164 applies an update equation to error signal 90 or alternative error signal 90', to delayed communication signal 92, and to data entries 208 stored in LUT 198 at addresses accessed by a delayed magnitude signal. When the control loop converges, processing section 164 implements transform $\cap F_{ML2}$, which corresponds to the $F_{ML2}$ transform applied by memoryless component 148 of model 94. In one embodiment $\cap F_{ML2}$ is configured with $F_{ML1}^{-1}$ to provide a better estimate of the combined inverse of $F_{ML1}$ in parallel with $F_{ML2}$ than is provided by $F_{ML1}^{-1}$ alone. In another embodiment, $\cap F_{ML2}$ is configured to approximate $F_{ML2}$.

Figure 10:
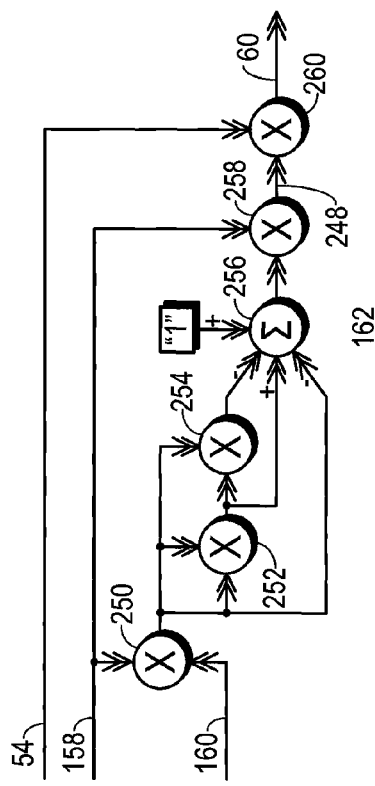
FIG. 10 shows a first embodiment of a joining and gain-adjusting section of the nonlinear predistorter depicted in FIG. 4.

FIG. 10 shows a first embodiment of joining and gain-adjusting section 162 (FIG. 4) of nonlinear predistorter 58 (FIG. 4). In particular, the FIG. 10 embodiment is suitable for use when processing section 156 (FIGS. 4 and 9) configures transform $\cap F_{ML2}$ to approximate $F_{ML2}$ from video memoryless component 148 (FIG. 4). In this embodiment, error signal 90 is supplied to derivative neutralizer 220 (FIG. 9).

Desirably, the parallel transforms of processing sections 154 and 156 (FIG. 4) collectively implement an estimate of the inverse of the parallel combination of $F_{ML1}$ and $F_{ML2}$ for memoryless components 146 and 148. That way the combined gain distortion applied by $F_{ML1}$ and $F_{ML2}$, when applied to a communication signal 60 whose gain has been predistorted by this inverse transform in joining and gain-adjusting section 162 is counteracted. Mathematically, $$(F_{ML1} + F_{ML2})^{-1} = F_{ML1}^{-1}(1 + F_{ML2}F_{ML1}^{-1}) \qquad \text{EQ. 1}$$
$$= F_{ML1}^{-1}\{1 - F_{ML2}F_{ML1}^{-1} + (F_{ML2}F_{ML1}^{-1})^2 - (F_{ML2}F_{ML1}^{-1})^3 + \ldots\} \qquad \text{EQ. 2}$$

Transform $F_{ML1}^{-1}$ may be established as discussed above in connection with FIG. 8. Transform $\cap F_{ML2}$ configured as an approximation of $F_{ML2}$ may be established as discussed above in connection with FIG. 9. Accordingly, the FIG. 10 embodiment of joining and gain-adjusting section 162 joins gain-correcting signals 158 and 160 as suggested by EQ. 2 to produce combined gain-correcting signal 248, and then uses combined gain-correcting signal 248 to define how to modulate the gain of communication signal 54 to generate predistorted communication signal 60.

Within joining and gain-adjusting section 162, a multiplier 250 receives gain-correcting signals 158 and 160 and produces the term $F_{ML2}F_{ML1}^{-1}$. An output of multiplier 250 couples to first and second inputs of a multiplier 252, a first input of a multiplier 254, and a negative input of a combiner 256. An output of multiplier 252 couples to a second input of multiplier 254 and to a positive input of combiner 256, and an output of multiplier 254 couples to a negative input of combiner 256. Multiplier 252 is responsible for the term: $(F_{ML2}F_{ML1}^{-1})^2$ from EQ. 2. Multiplier 254 is responsible for the term: $(F_{ML2}F_{ML1}^{-1})^3$ from EQ. 2. A constant value of [1,1] is applied to a positive input of combiner 256. An output from combiner 256 couples to a first input of a multiplier 258, and gain-correcting signal 158 drives a second input of multiplier 258. The output of multiplier 258 generates combined gain-correcting signal 248.

Communication signal 54 drives a first input of a multiplier 260, and gain-correcting signal 248 drives a second input of multiplier 260. An output of multiplier 260 generates predistorted communication signal 60. At multiplier 260, communication signal 54 is predistorted by adjusting the gain of communication signal 54 in accordance with the dictates of combined gain-correcting signal 248.

In particular, a specific amount of gain, that may differ for each magnitude value that communication signal 54 exhibits within the range of magnitude values exhibited by communication signal 54, has been applied to each sample of communication signal 54. The amount of gain applied is responsive to the derivative of the magnitude of communication signal 54 as well as to the magnitude of communication signal 54. For the stream of samples in communication signal 54, the amount of gain applied at multiplier 260 approximates the inverse of the collective gain associated with memoryless components 146 and 148 of nonlinear amplifier transform 98 (FIG. 4) from model 94 (FIG. 4).

While the FIG. 10 embodiment of joining and gain-adjusting section 162 provides effective results, it requires the use of a number of complex multiplies to implement an estimate of a mathematical inverse. The use of this number of complex multiplies and the power they consume for each sample of communication signal 54 is somewhat undesirable.

Figure 11:
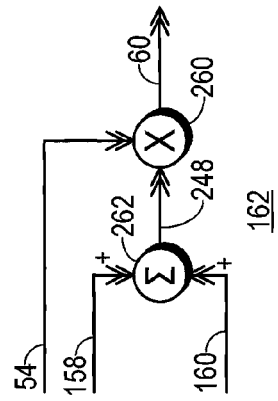
FIG. 11 shows a second embodiment of the joining and gain-adjusting section of the nonlinear predistorter depicted in FIG. 4.

FIG. 11 shows a second embodiment of joining and gain-adjusting section 162 of the nonlinear predistorter 58. The FIG. 11 embodiment represents a simplification over the FIG. 10 embodiment, and it requires fewer complex multiply operations and consumes correspondingly less power. The FIG. 11 embodiment is suitable for use when processing section 156 (FIGS. 4 and 9) configures transform $\cap F_{ML2}$ with $F_{ML1}^{-1}$ to provide a better estimate of the combined inverse of $F_{ML1}$ in parallel with $F_{ML2}$ than is provided by $F_{ML1}^{-1}$ alone. In this embodiment, alternate error signal 90' is supplied to derivative neutralizer 220 (FIG. 9).

In this FIG. 11 embodiment, gain-correcting signal 160 generated through the application of transform $\cap F_{ML2}$ is viewed as an offset to gain-correcting signal 158, which is generated through the application of transform $F_{ML1}^{-1}$. But nothing requires $F_{ML1}^{-1}$ for this embodiment to precisely equal $F_{ML1}^{-1}$ for the other embodiment or to precisely equal the inverse of gain-droop component 146 considered by itself. Accordingly, gain-correcting signal 158 and gain-correcting signal 160 are applied to positive inputs of a combiner 262. An output of combiner 262 provides combined gain-correcting signal 248. As in the FIG. 10 embodiment, communication signal 54 drives a first input of multiplier 260, and combined gain-correcting signal 248 drives a second input of multiplier 260. An output of multiplier 260 generates predistorted communication signal 60. At multiplier 260, communication signal 54 is predistorted by adjusting the gain of communication signal 54 in accordance with the dictates of combined gain-correcting signal 248.

Figure 12:
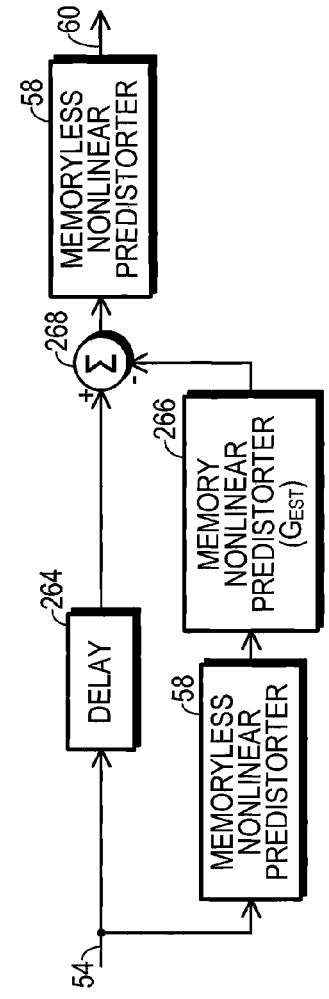
FIG. 12 shows a block diagram of a second embodiment of the nonlinear predistorter portion of the transmitter.

FIG. 12 shows a block diagram of a second embodiment of nonlinear predistorter 58, referred to as nonlinear predistorter 58'. Nonlinear predistorter 58' is not limited to addressing memoryless components 100 of nonlinear amplifier transform 98 (FIG. 4). Thus, nonlinear predistorter 58' may be suitable where thermal memory effects are significant or where electrical memory effects are significant. Electrical memory effects may be significant, for example, where envelope trapping capacitance is used in network of components 138 (FIG. 5). Nonlinear predistorter 58' consumes more power than nonlinear predistorter 58, but is better able to extend predistortion to cover significant memory effects.

In predistorter 58', communication signal 54 drives a delay element 264 and a memoryless nonlinear predistorter 58. Memoryless nonlinear predistorter 58 may be configured as discussed above in connection with FIGS. 4-11. The output from memoryless nonlinear predistorter 58 drives a memory effects nonlinear predistorter 266. Memory effects nonlinear predistorter 266 desirably applies a transform $G_{EST}$, which represents an estimate of transform G applied by memory components 102 from model 94 (FIG. 4). An output of memory effects nonlinear predistorter 266 drives a negative input of a combiner 268 while a delayed version of communication signal 54 from delay element 264 drives a positive input of combiner 268. An output of combiner 268 drives an input of another memoryless nonlinear predistorter 58, which is desirably configured identically to the other memoryless nonlinear predistorter 58 depicted in FIG. 12. An output of this memoryless nonlinear predistorter 58 provides predistorted communication signal 60.

In summary, at least one embodiment of the present invention provides a linearized transmitter and a transmitter linearizing method that expand linearization efforts to address inductively induced distortion, including distortion resulting from video signal bias modulation. In accordance with at least one embodiment, effective amounts of linearization are provided at low power. In accordance with at least one embodiment, a memoryless nonlinear predistorter is provided that compensates for video signal effects. In accordance with at least one embodiment, a network of components coupled to an active amplifying device is configured to minimize memory effects.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams and circuit diagrams may be partitioned in equivalent but different ways than shown and discussed herein. Such equivalent but different ways and the modifications and adaptations which may be implemented to achieve them are to be included within the scope of the present invention. Likewise, while certain operational conditions have been mentioned herein for the purposes of teaching the invention, the invention may be applied in connection with other operational conditions. For example, constant bias supply voltages $V_g$ and $V_d$ are not a requirement, and the present invention may also apply to transmitters that vary bias supply voltages $V_g$ and $V_d$ to improve amplifier efficiency.

What is claimed is:

1. A method of linearizing a transmitter having an amplifier which applies a nonlinear amplifier transform to a signal input at said amplifier while operating at a variety of bias conditions characterized by an average bias condition and deviations from said average bias condition, said deviations being caused at least in part by said amplifier applying said nonlinear amplifier transform to said signal input at said amplifier, and said method comprising:

generating a gain-correcting signal responsive to said deviations from said average bias condition;

adjusting gain of a communication signal in response to said gain-correcting signal to form a predistorted communication signal; and forming said signal input at said amplifier from said predistorted communication signal.

2. A method as claimed in claim 1 wherein said gain-correcting signal is responsive to a derivative of said communication signal.

3. A method as claimed in claim 2 wherein said derivative is performed with respect to time and is responsive to a magnitude parameter of said communication signal.

4. A method as claimed in claim 2 wherein:
said gain-correcting signal is proportional to a magnitude parameter of said communication signal; and
a proportion value by which said gain-correcting signal is proportional to said magnitude parameter varies with said magnitude parameter.

5. A method as claimed in claim 2 wherein:
said gain-correcting signal is also responsive to a polynomial signal; and
said method additionally comprises generating said polynomial signal by performing a series of look-up operations using a look-up table addressed by a magnitude parameter of said communication signal.

6. A method as claimed in claim 1 additionally comprising:
normalizing gain of said predistorted communication signal in an automatic gain control section prior to forming said signal input at said amplifier; and
updating said automatic gain control section using a control loop having a loop bandwidth configured to track thermal memory effect nonlinearities of said amplifier.

7. A method as claimed in claim 1 wherein:
a network of components are coupled to said amplifier;
said method additionally comprises configuring said network of components to exhibit an impedance to said amplifier that either remains constant with increasing frequency or increases with increasing frequency throughout a video signal bandwidth.

8. A method as claimed in claim 1 wherein:
said nonlinear amplifier transform has at least one memoryless component, said at least one memoryless component characterizing said deviations from said average bias condition; and
said gain-correcting signal is generated by a processing section that is responsive to said communication signal and applies a transform which corresponds to said at least one memoryless component of said nonlinear amplifier transform.

9. A method as claimed in claim 1 wherein said gain-correcting signal is a first gain-correcting signal, and said method additionally comprises:
generating a second gain-correcting signal contemporaneous with said first gain-correcting signal, said second gain-correcting signal being responsive to an average gain droop of said amplifier for said average bias condition; and
joining said first and second gain-correcting signals prior to adjusting said gain of said communicational signal to form said predistorted communication signal.

10. A linearized transmitter having an amplifier which applies a nonlinear amplifier transform to a signal input at said amplifier while operating at a variety of bias conditions characterized by an average bias condition and deviations from said average bias condition, said deviations being caused at least in part by said amplifier applying said nonlinear amplifier transform to said signal input at said amplifier, and said transmitter comprising:
a processing section configured to produce a gain-correcting signal responsive to a communication signal and responsive to said deviations from said average bias condition; and
a gain-adjusting section configured to generate a predistorted communication signal in which gain is applied to said communication signal in response to said gain-correcting signal;
wherein said signal input at said amplifier is formed from said predistorted communication signal.

11. A linearized transmitter as claimed in claim 10 wherein said processing section comprises:
a polynomial generator responsive to said communication signal; and
a differentiator coupled to said polynomial generator.

12. A linearized transmitter as claimed in claim 11 wherein said polynomial generator is implemented using a look-up table addressed by a magnitude parameter of said communication signal, said look-up table being updated in response to an error signal generated from said communication signal and a signal output from said amplifier.

13. A linearized transmitter as claimed in claim 10 additionally comprising an automatic gain control section configured to normalize gain of said predistorted communication signal prior to forming said signal input at said amplifier, said automatic gain control section being responsive to a control loop having an update loop bandwidth configured to track thermal memory effect nonlinearities of said amplifier.

14. A linearized transmitter as claimed in claim 10 additionally comprising a network of components coupled to said amplifier, said network of components being configured to exhibit an impedance to said amplifier that either remains constant with increasing frequency or increases with increasing frequency throughout a video signal bandwidth.

15. A linearized transmitter as claimed in claim 10 wherein said processing section is a first processing section, said gain-correcting signal is a first gain-correcting signal, and said linearized transmitter additionally comprises:
a second processing section configured to generate a second gain-correcting signal contemporaneous with said first gain-correcting signal, said second gain-correcting signal being responsive to said communication signal and to an average gain droop of said amplifier for said average bias condition; and
a joining section responsive to said communication signal and to said first and second gain-correcting signals and configured to generate said predistorted communication signal in response to said communication signal and said first and second gain-correcting signals.

16. A linearized transmitter as claimed in claim 10 wherein said processing section is configured so that said gain-correcting signal is substantially unresponsive to said average bias condition.

17. A linearized transmitter having an amplifier which applies a nonlinear amplifier transform to a signal input at said amplifier, said nonlinear amplifier transform having a first memoryless component and a second memoryless component, said linearized transmitter comprising:
a first processing section responsive to a communication signal and configured to generate a first gain-correcting signal by applying a first transform which corresponds to said first memoryless component of said nonlinear amplifier transform;
a second processing section responsive to said communication signal and configured to generate a second gain-correcting signal contemporaneous with said first gain-correcting signal by applying a second transform which corresponds to said second memoryless component of said nonlinear amplifier transform; and
a joining section responsive to said communication signal and to said first and second gain-correcting signals and configured to generate a predistorted communication signal in which gain is applied to said communication signal in response to said first and second gain-correcting signals;
wherein said signal input at said amplifier is formed from said predistorted communication signal.

18. A linearized transmitter as claimed in claim 17 additionally comprising a network of components coupled to said amplifier, said network of components being configured to exhibit an impedance to said amplifier that either remains constant with increasing frequency or increases with increasing frequency throughout a video signal bandwidth.

19. A linearized transmitter as claimed in claim 17 wherein said first transform approximates an inverse of said first memoryless component of said nonlinear amplifier transform.

20. A linearized transmitter as claimed in claim 19 wherein said joining section and said second processing section are mutually configured so that said joining section applies an amount of gain to said communication signal, for each magnitude value within a range of magnitude for said communication signal, which is approximately the inverse of the collective gain associated with said first and second memoryless components of said nonlinear amplifier transform.

21. A linearized transmitter as claimed in claim 19 wherein said second transform approximates said second memoryless component of said nonlinear amplifier transform.

22. A linearized transmitter as claimed in claim 19 wherein said joining section adds said first and second gain-correcting signals together to define said gain applied to said communication signal.

23. A linearized transmitter as claimed in claim 17 wherein:
said first memoryless component of said nonlinear amplifier transform characterizes gain droop at an average bias condition for said amplifier; and
said second memoryless component of said nonlinear amplifier transform characterizes gain modulation in said amplifier resulting from envelope-induced deviations from said average bias condition.

24. A linearized transmitter as claimed in claim 17 wherein said second processing section comprises:
a polynomial generator responsive to said communication signal; and
a differentiator coupled to said polynomial generator.

25. A linearized transmitter as claimed in claim 24 wherein said polynomial generator is implemented using a look-up table addressed by a magnitude parameter of said communication signal, said look-up table being updated in response to an error signal generated from said communication signal and a signal output from said amplifier.

26. A linearized transmitter as claimed in claim 25 wherein:
said look-up table is a first look-up table;
said first look-up table is updated by applying a first update equation to said error signal; and
said first processing section includes a second look-up table updated by applying a second update equation to said error signal.

27. A linearized transmitter as claimed in claim 17 additionally comprising an automatic gain control section configured to normalize gain of said predistorted communication signal prior to forming said signal input at said amplifier, said automatic gain control section being responsive to a control loop having an update loop bandwidth configured to track thermal memory effect nonlinearities of said amplifier.

28. A method of linearizing a transmitter having an amplifier which applies a nonlinear amplifier transform to a signal input at said amplifier and which couples to a network of components exhibiting an inductive impedance, said method comprising:
generating a first gain-correcting signal responsive to a derivative with respect to time of a communication signal;
generating a second gain-correcting signal contemporaneous with said first gain-correcting signal, said second gain-correcting signal being responsive to an average gain droop of said amplifier;
joining said first and second gain-correcting signals to form a joined gain-correcting signal;
adjusting gain of said communication signal in response to said joined gain-correcting signal to form a predistorted communication signal; and
forming said signal input at said amplifier from said predistorted communication signal.

* * * * *